ns011046059B2

United States Patent
Larrieu et al.

(10) Patent No.: US 11,046,059 B2
(45) Date of Patent: Jun. 29, 2021

(54) BARRIER FILM OR SHEET AND LAMINATED PACKAGING MATERIAL COMPRISING THE FILM OR SHEET AND PACKAGING CONTAINER MADE THEREFROM

(71) Applicant: Tetra Laval Holdings & Finance S.A., Pully (CH)

(72) Inventors: Jerome Larrieu, Bulle (CH); Pierre Fayet, Lausanne (CH)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 254 days.

(21) Appl. No.: 15/771,330

(22) PCT Filed: Oct. 25, 2016

(86) PCT No.: PCT/EP2016/075695
§ 371 (c)(1),
(2) Date: Apr. 26, 2018

(87) PCT Pub. No.: WO2017/072122
PCT Pub. Date: May 4, 2017

(65) Prior Publication Data
US 2018/0311939 A1    Nov. 1, 2018

(30) Foreign Application Priority Data

Oct. 29, 2015  (EP) .................................... 15192206
Oct. 29, 2015  (EP) .................................... 15192208
Oct. 29, 2015  (EP) .................................... 15192211

(51) Int. Cl.
*B32B 1/08*  (2006.01)
*B32B 27/00*  (2006.01)
(Continued)

(52) U.S. Cl.
CPC ................ *B32B 27/08* (2013.01); *B32B 7/12* (2013.01); *B32B 27/10* (2013.01); *B32B 27/306* (2013.01);
(Continued)

(58) Field of Classification Search
CPC .. B32B 7/02; B32B 7/12; B32B 27/08; Y10T 428/277
(Continued)

(56) References Cited

U.S. PATENT DOCUMENTS 7,806,981 B2 * 10/2010 Fayet .................... C23C 14/352
                                                                   118/718
2008/0102222 A1   5/2008 Fujinawa et al.
2012/0100320 A1 * 4/2012 Toft .......................... B32B 7/02
                                                                   428/35.6

FOREIGN PATENT DOCUMENTS

CN        1689133 A      10/2005
CN      103608178 A       2/2014
(Continued)

OTHER PUBLICATIONS

Extended European Search Report for European Application No. 15192206.9 dated Feb. 12, 2016 in 8 pages.
(Continued)

*Primary Examiner* — Ellen S Hock
(74) *Attorney, Agent, or Firm* — Knobbe, Martens, Olson & Bear, LLP

(57) ABSTRACT

Barrier films comprising a PECVD barrier coating from diamond-like carbon are disclosed, along with methods of manufacturing such films, and laminated packaging materials comprising such films, in particular for liquid food packaging, are disclosed. Packaging containers comprising the laminated packaging material or being made from the
(Continued)

laminated packaging material, in particular a packaging container for liquid food packaging, are also disclosed.

15 Claims, 11 Drawing Sheets

(51) Int. Cl.
    *B32B 27/08* (2006.01)
    *B32B 7/12* (2006.01)
    *B32B 27/32* (2006.01)
    *B32B 27/36* (2006.01)
    *B65D 85/72* (2006.01)
    *B65D 8/00* (2006.01)
    *B65D 75/12* (2006.01)
    *B65D 75/48* (2006.01)
    *B65D 5/06* (2006.01)
    *B65B 1/02* (2006.01)
    *B65D 5/56* (2006.01)
    *B32B 27/30* (2006.01)
    *B65B 7/28* (2006.01)
    *B65B 51/26* (2006.01)
    *B65B 9/20* (2012.01)
    *B65D 5/62* (2006.01)
    *B32B 27/10* (2006.01)
    *B32B 27/34* (2006.01)
    *C23C 16/27* (2006.01)
    *B65D 5/74* (2006.01)

(52) U.S. Cl.
    CPC ............ *B32B 27/32* (2013.01); *B32B 27/325* (2013.01); *B32B 27/34* (2013.01); *B32B 27/36* (2013.01); *B65B 1/02* (2013.01); *B65B 7/2878* (2013.01); *B65B 9/2049* (2013.01); *B65B 51/26* (2013.01); *B65D 5/064* (2013.01); *B65D 5/067* (2013.01); *B65D 5/563* (2013.01); *B65D 5/62* (2013.01); *B65D 11/04* (2013.01); *B65D 15/02* (2013.01); *B65D 75/12* (2013.01); *B65D 75/48* (2013.01); *B65D 85/72* (2013.01); *C23C 16/27* (2013.01); *B32B 2255/00* (2013.01); *B32B 2255/10* (2013.01); *B32B 2255/20* (2013.01); *B32B 2307/7244* (2013.01); *B32B 2307/7246* (2013.01); *B32B 2307/7248* (2013.01); *B32B 2439/46* (2013.01); *B32B 2439/60* (2013.01); *B32B 2439/62* (2013.01); *B32B 2439/70* (2013.01); *B65D 5/746* (2013.01); *Y10T 428/1307* (2015.01); *Y10T 428/1352* (2015.01)

(58) Field of Classification Search
    USPC .............................................. 428/35.6, 34.1
    See application file for complete search history.

(56) References Cited

FOREIGN PATENT DOCUMENTS

| | | |
|---|---|---|
| JP | 2002 145346 A | 5/2002 |
| JP | 2002 200694 A | 7/2002 |
| JP | 2004 314407 A | 11/2004 |
| JP | 2005 088452 A | 11/2004 |
| JP | 2006 315359 A | 11/2006 |
| JP | 2008 173936 A | 7/2008 |
| JP | 2008 248374 A | 10/2008 |
| WO | WO 2013/041469 A1 | 3/2013 |

OTHER PUBLICATIONS

International Search Report for Application No. PCT/EP2016/075695 dated Jan. 25, 2017 in 3 pages.

* cited by examiner

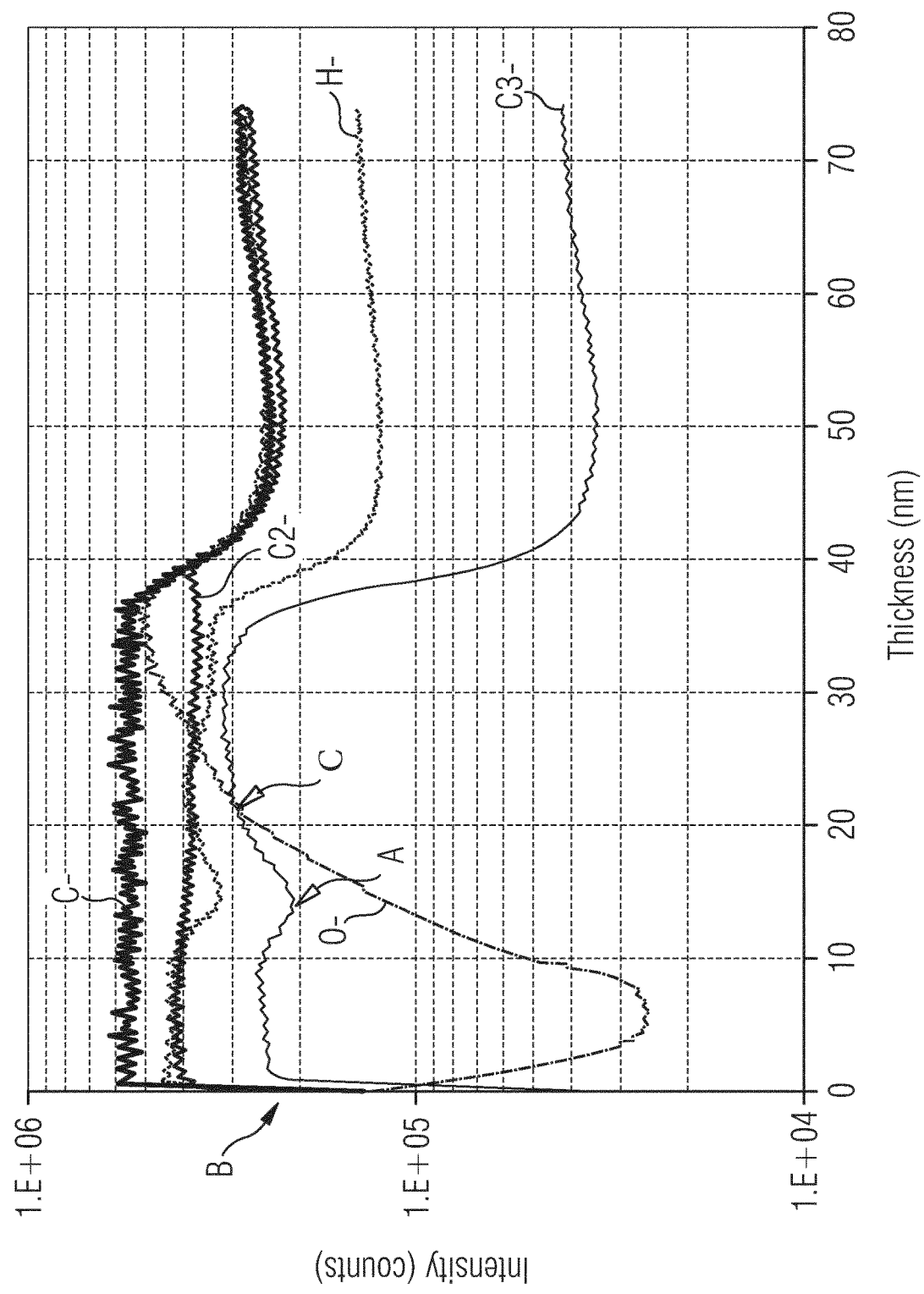

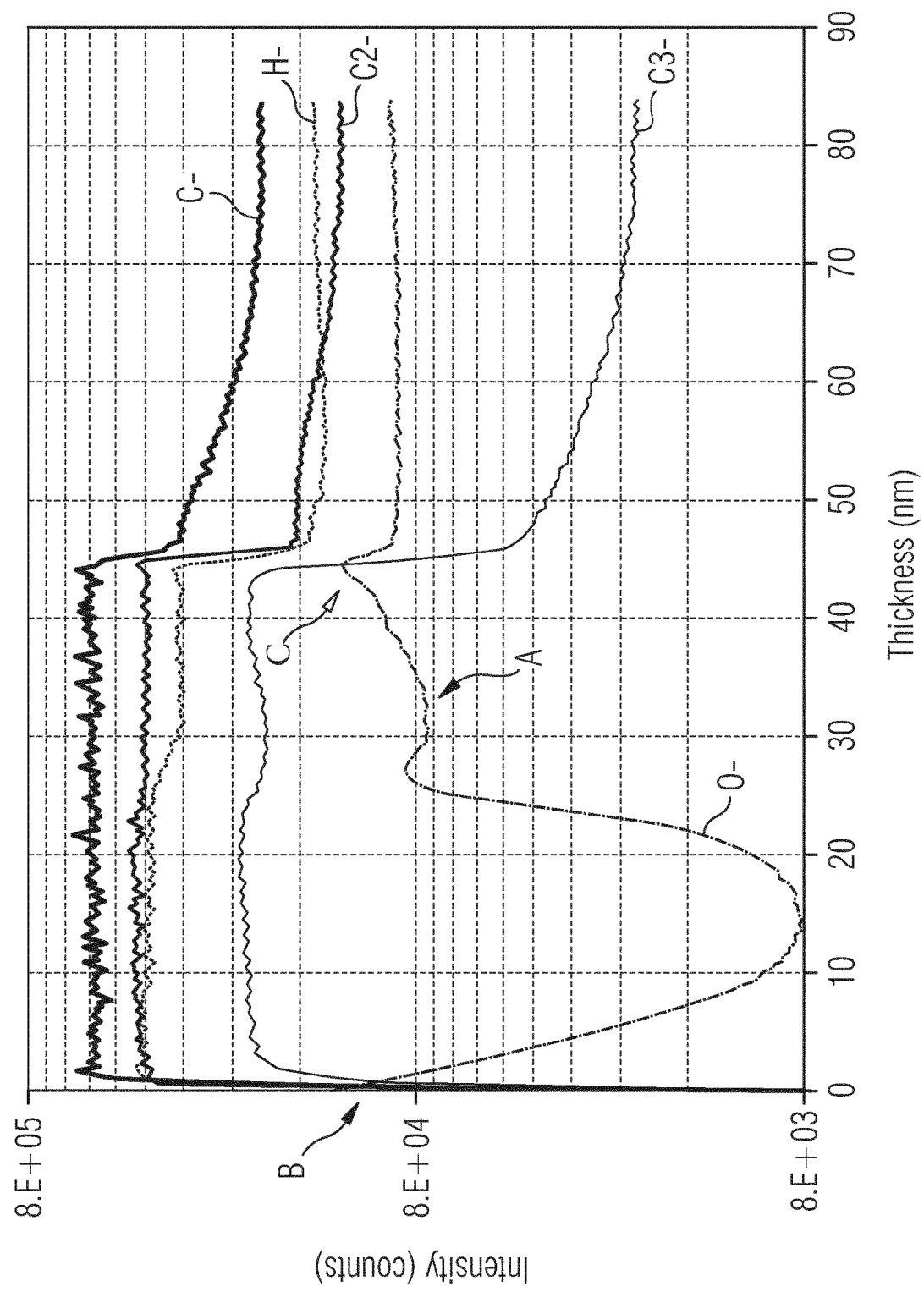

BARRIER FILM OR SHEET AND LAMINATED PACKAGING MATERIAL COMPRISING THE FILM OR SHEET AND PACKAGING CONTAINER MADE THEREFROM

TECHNICAL FIELD

The present invention relates to a durable barrier film having a vapour deposited barrier coating of amorphous durable diamond-like carbon, DLC. The invention also relates to laminated packaging materials comprising such barrier films, in particular intended for liquid food packaging.

Furthermore, the invention relates to packaging containers comprising the laminated packaging material or being made of the laminated packaging material. In particular, the invention relates to packaging containers intended for liquid food packaging.

BACKGROUND OF THE INVENTION

Packaging containers of the single use disposable type for liquid foods are often produced from a packaging laminate based on paperboard or carton. One such commonly occurring packaging container is marketed under the trademark Tetra Brik Aseptic® and is principally employed for aseptic packaging of liquid foods such as milk, fruit juices etc, sold for long term ambient storage. The packaging material in this known packaging container is typically a laminate comprising a bulk or core layer, of paper, paperboard or other cellulose-based material, and outer, liquid-tight layers of thermoplastics. In order to render the packaging container gas-tight, in particular oxygen gas-tight, for example for the purpose of aseptic packaging and packaging of milk or fruit juice, the laminate in these packaging containers normally comprises at least one additional layer, most commonly an aluminium foil.

On the inside of the laminate, i.e. the side intended to face the filled food contents of a container produced from the laminate, there is an innermost layer, applied onto the aluminium foil, which innermost, inside layer may be composed of one or several part layers, comprising heat sealable thermoplastic polymers, such as adhesive polymers and/or polyolefins. Also on the outside of the bulk layer, there is an outermost heat sealable polymer layer.

The packaging containers are generally produced by means of modern, high-speed packaging machines of the type that form, fill and seal packages from a web or from prefabricated blanks of packaging material. Packaging containers may thus be produced by reforming a web of the laminated packaging material into a tube by both of the longitudinal edges of the web being united to each other in an overlap joint by welding together the inner- and outermost heat sealable thermoplastic polymer layers. The tube is filled with the intended liquid food product and is thereafter divided into individual packages by repeated transversal seals of the tube at a predetermined distance from each other below the level of the contents in the tube. The packages are separated from the tube by incisions along the transversal seals and are given the desired geometric configuration, normally parallelepipedic, by fold formation along prepared crease lines in the packaging material.

The main advantage of this continuous tube-forming, filling and sealing packaging method concept is that the web may be sterilised continuously just before tube-forming, thus providing for the possibility of an aseptic packaging method, i.e. a method wherein the liquid content to be filled as well as the packaging material itself are reduced from bacteria and the filled packaging container is produced under clean conditions such that the filled package may be stored for a long time even at ambient temperature, without the risk of growth of micro-organisms in the filled product. Another important advantage of the Tetra Brik®-type packaging method is, as stated above, the possibility of continuous high-speed packaging, which has considerable impact on cost efficiency.

Packaging containers for sensitive liquid food, for example milk or juice, can also be produced from sheet-like blanks or prefabricated blanks of the laminated packaging material of the invention. From a tubular blank of the packaging laminate that is folded flat, packages are produced by first of all building the blank up to form an open tubular container capsule, of which one open end is closed off by means of folding and heat-sealing of integral end panels. The thus closed container capsule is filled with the food product in question, e.g. juice, through its open end, which is thereafter closed off by means of further folding and heat-sealing of corresponding integral end panels. An example of a packaging container produced from sheet-like and tubular blanks is the conventional so-called gable-top package. There are also packages of this type which have a moulded top and/or screw cap made of plastic.

A layer of an aluminium foil in the packaging laminate provides gas barrier properties quite superior to most polymeric gas barrier materials. The conventional aluminium-foil based packaging laminate for liquid food aseptic packaging is still the most cost-efficient packaging material, at its level of performance, available on the market today.

Any other material to compete with the foil-based materials must be cost-efficient regarding raw materials, have comparable food preserving properties and have a comparably low complexity in the converting into a finished packaging laminate.

Among the efforts of developing non-aluminium-foil materials for liquid food carton packaging, there is also a general incentive towards developing pre-manufactured films or sheets having high and multiple barrier functionalities, i.e. not only oxygen and gas barrier but also water vapour, chemical- or aroma-substance barrier properties, which may just replace the aluminium-foil barrier material, of the conventional laminated packaging material, and adapt it to the conventional Al-foil process for lamination and manufacturing.

This has been difficult, however, because most alternative barrier films provide insufficient barrier or mechanical strength properties to a laminated packaging material, generate too high total packaging material costs, or fail due to both said aspects. In particular, films having two or more consecutive layers for providing barrier properties, become too expensive to be economically feasible in a packaging laminate. When it is necessary to complement the main barrier layer, or main barrier coating, of the film, with further layers in order to provide sufficient barrier properties, or to provide improved mechanical properties to the barrier film, costs are added to the packaging material structure as a whole, because such multi-barrier films and packaging materials are much more expensive to manufacture.

DISCLOSURE OF THE INVENTION

It is, accordingly, an object of the present invention to overcome, or at least alleviate, the above-described problems in barrier films and sheets for laminating into packaging materials.

It is also a general object of the invention to provide barrier films or sheets having barrier properties and other properties that fulfil the needs in liquid carton laminated packaging materials.

It is a further general object of the invention to provide packaging materials for oxygen-sensitive products, such as laminated packaging materials for liquid, semi-solid or wet food products, which do not contain aluminium foil but still have good gas and other barrier properties suitable for long-term, aseptic packaging at reasonable cost.

A particular object, is to provide a, relative to aluminium foil barrier materials, cost-efficient, non-foil, paper- or paperboard-based, laminated packaging material, having good gas barrier properties, and good water vapour barrier properties, for the purpose of manufacturing packages for long-term, aseptic food storage.

Yet a further object of the invention is to provide a cost-efficient, non-foil, paper- or paperboard-based and heat-sealable packaging laminate having good gas barrier properties, good water vapour barrier properties and good internal adhesion between the layers, for the purpose of manufacturing aseptic packaging containers for long-term storage of liquid foods at maintained nutritional quality under ambient conditions.

These objects are thus attainable according to the present invention by the barrier film, the laminated packaging material, the packaging container and the method of manufacturing the packaging material, as defined in the appended claims.

With the term "long-term storage" in connection with the present invention, is meant that the packaging container should be able to preserve the qualities of the packed food product, i.e. nutritional value, hygienic safety and taste, at ambient conditions for at least 1 or 2 months, such as at least 3 months, preferably longer, such as 6 months, such as 12 months, or more.

With the term "package integrity", is generally meant the package durability, i.e. the resistance to leakage or breakage of a packaging container. A main contribution to this property is that within a packaging laminate there is provided good internal adhesion between adjacent layers of the laminated packaging material. Another contribution comes from the material resistance to defects, such as pinholes, ruptures and the like within the material layers, and yet another contribution comes from the strength of the sealing joints, by which the material is sealed together at the formation of a packaging container. Regarding the laminated packaging material itself, the integrity property is thus mainly focused on the adhesion of the respective laminate layers to its adjacent layers, as well as the quality of the individual material layers.

According to a first aspect of the invention, the general objects are attained by a durable barrier film, for use in laminated packaging materials for liquid food products and for packaging of products sensitive to oxygen and other gases, the barrier film comprising a polymer film substrate and a durable diamond-like carbon (DLC) barrier coating vapour-deposition coated thereon, providing gas barrier properties as well as water vapour barrier properties in a packaging material and packages made thereof, the coating being a single-layer gradient diamond-like coating, DLC, exhibiting from the interface with the polymer film substrate throughout the depth of the coating towards the surface thereof, a gradient of decreasing oxygen ion content to a minimum value and a subsequent increase, the decreasing gradient having a slope of from above $5 \cdot 10^4$ and up to $5 \cdot 10^5$ counts per nanometer coating thickness, such as from $8 \cdot 10^4$ to $1.2 \cdot 10^5$, such as from $9 \cdot 10^4$ to $1.1 \cdot 10^5$, such as $10^5$, counts per nanometer, the minimum value being located at from 40 to 60%, such as at from 45 to 55%, such as at 50% of the depth of the coating, as measured from the surface of the barrier coating (B), to the interface (A) between the barrier coating and the polymer film, as depicted by an intensity-versus thickness diagram by surface analysis by Dynamic Time of Flight Secondary ion Mass Spectroscopy, ToF-SiMS, calibrated to a TEM microscopy thickness measurement, while the concentrations of the carbon and hydrogen ionic groups remain at a substantially constant level throughout the depth of the coating.

Thus, the coating is a single-layer gradient diamond-like coating, DLC, exhibiting mainly three zones, with gradient interfaces between them, of which zones, as observed from the polymer film substrate and outwards through the barrier coating towards the surface of the coated barrier film, and as depicted by an intensity-versus-time diagram by surface analysis by Dynamic Time of Flight Secondary ion Mass Spectroscopy, ToF-SiMS, the first zone exhibits an oxygen concentration uptake, close to the surface of the polymer film substrate C, the second zone exhibits a decreasing oxygen concentration, as a negative slope seen from right to left in the diagram, while the third zone exhibits a recovery of the oxygen concentration, at the surface of the DLC coating B, the concentrations of the carbon and hydrogen ionic groups remaining at a substantially constant level throughout the three coating zones and the depth of the coating.

According to a further embodiment, there is a local and temporary concentration-deficit/-depletion A, i.e. a smaller decrease and recovery, of the hydrogen and triple carbon ions, located at a coating thickness of 10-15 nm, as measured from the surface of the polymer film substrate C, i.e. within 10-15 nm from the surface of the polymer film substrate C.

According to an embodiment, the polymer film substrate is a film selected from the group consisting of films based on polyesters or polyamides or on blends thereof, and on multilayer films having a surface layer comprising said polyesters or polyamides or blends thereof.

According to another embodiment, the polymer film substrate is a film selected from the group consisting of films based on polyethylene terephthalate (PET), mono- or biaxially oriented PET (OPET, BOPET), non- or mono- or biaxially oriented polyethylene furanoate (PEF), oriented or non-oriented polybutylene terephthalate (PBT), polyethylene napthanate (PEN), polyamide, non-oriented or oriented polyamide (PA, OPA, BOPA), polyolefins such as polypropylene, mono- or biaxially oriented polypropylene (PP, OPP, BOPP), polyethylenes such as oriented or non-oriented high density polyethylene (HDPE), linear low density polyethylene (LLDPE) and cyclo-olefin co-polymers (COC), or on blends of two or more of said polymers, or on multilayer films having a surface layer comprising such polymers or blends thereof.

According to a more specific embodiment, the polymer film substrate is a film selected from the group consisting of films based on polyesters or polyamides or on blends or laminate combinations of such polymers. According to a further specific embodiment, the polymer film substrate is a film selected from the group consisting of films based on polyethylene terephthalate (PET), mono- or biaxially oriented PET (OPET, BOPET), polybutylene terephthalate (PBT), polyethylene napthanate (PEN), non-oriented polyamide, oriented polyamide (PA, OPA, BOPA), or on blends of two or more of said polymers, or on multilayer films having a surface layer comprising such polymers or blends thereof. According to an embodiment, the polyamide is selected from a the group consisting of aliphatic polyamides, such as polyamide 6 or polyamide 6,6, semi-aromatic polyamides, such as nylon-MXD6 or Selar, or blends of aliphatic and semi-aromatic polyamides.

According to an even more specific embodiment, the polymer film substrate is an oriented PET film.

According to another embodiment, the polymer film substrate has a thickness of 12 μm or lower, such as from 8 to 12 μm, such as 12 μm.

Thinner polymer film substrates do exist commercially and would be feasible within the scope of the present invention, but it is presently not realistic to go below 8 μm, and films thinner than 4 μm would be difficult from a web-handling point of view in industrial coating and lamination processes for packaging. On the other hand, films thicker than 12-15 μm are of course feasible but less interesting for laminated packaging materials of the invention from a cost-efficiency view, and also since they add too much strength and toughness for the functionality of opening devices and perforations. According to an embodiment, the polymer film substrate should be 12 μm or below, such as an oriented PET film of from 10 to 12 μm, such as about 12 μm. At higher thickness of the film substrate, the tearing and cutting properties of the laminated packaging material are impaired because of the higher strength of the material.

According to a further embodiment, the polymer film substrate has an adhesion-promoting primer coating on its other side, opposite the side coated with the single-layer gradient durable DLC barrier coating. The adhesion-promoting primer coating may be a composition comprising a compound selected from the group of aminosilanes and polyethyleneimines.

According to a further embodiment, the durable DLC barrier coating is deposited to a thickness of from 2 to 50 nm, such as from 5 to 40 nm, such as from 5 to 35 nm, such as from 10 to 35 nm, such as from 20 to 30 nm.

According to a further embodiment, the durable DLC barrier coating has a content of sp2 bonds from 60 to 70%, based on the total content of sp2 and sp3 hybrid bonds in the durable DLC coating. Coatings of particularly good properties have proven to have such configuration.

The durable barrier film obtained by the above method, shows excellent properties in many respects, such as low OTR, low WVTR, good aroma and odour barrier properties as well as good chemical resistance, and proves to have good mechanical properties in subsequent handling operations such as lamination into a laminated packaging material and the fold-forming and sealing operations of such a laminated material into packages. The excellent mechanical properties are believe to be explainable by the durability of the DLC barrier coating being optimised by the PECVD coating method conditions, and meaning that there is good cohesion within the deposited DLC barrier layer, as well as good adhesion and bonding to the surface of the polymer film substrate. An important indicator of such excellent mechanical properties, as useful for liquid packaging, is the crack-onset-strain, COS, i.e. the strain of the barrier film, at which the oxygen barrier properties begin to deteriorate. It has been seen that for PET-based films, the COS for the durable DLC coating is above 2%.

Thus, according to an embodiment, a barrier film comprising a polymer film substrate of PET, having a thickness of 12 μm or lower, and a durable DLC barrier coating, vapour deposition coated onto the polymer film substrate at a thickness from 20 to 30 nm, the film having an oxygen transmission rate, OTR, lower than or equal to an upper specification limit of 3.0 cc/day/m2/atm, as measured by Mocon 2/60 at 23° C. and 50% RH, and a water vapour transmission rate, WVTR, lower than or equal to 1 g/day/m2, as measured by Mocon Permatran or Lyssy equipment, at 38° C. and 20% RH, and a crack onset strain, COS, equal to or above 2%.

For some purposes and according to some embodiments, in order to reach suitable oxygen barrier properties in a final and filled packages made form a laminated carton material for liquid packaging, the oxygen barrier of the barrier film from the beginning should be better than or equal to 3.0 cc/day/m$^2$/atm, at 23° C. and 50% RH. Of course, it is better if the film barrier is as good as possible, but this is regarded to be a limit OTR level that is useful for some purposes of liquid food packaging.

According to another embodiment, the polymer film substrate has an adhesion-promoting primer coating on its other side, opposite the side coated with the single-layer gradient durable DLC barrier coating. The purpose of the adhesion-promoting primer coating is, to create or improve the adhesion strength to an adjacent extrusion-coated polymer, such as a polyolefin-based polymer layer and the contacting surface thereof.

In an embodiment of the laminated packaging material, the adhesion-promoting primer coating is a composition comprising a compound selected from the group consisting of aminosilanes and polyethyleneimines.

In a further embodiment of the laminated packaging material, the adhesion-promoting primer coating is a second coating of an amorphous diamond-like coating (DLC). Such an adhesion-promoting primer DLC coating, is applied at a thickness from 2 to 50 nm, such as from 2 to 10 nm, such as from 2 to 5 nm.

In a second aspect of the invention, a laminated packaging material comprising the barrier film of the invention is provided. The laminated packaging material may further comprise a first outermost liquid tight, heat sealable polyolefin layer and a second innermost liquid tight, heat sealable polyolefin layer.

According to one embodiment, the laminated packaging material comprises a bulk layer of paper or paperboard, a first outermost liquid tight, heat sealable polyolefin layer, a second innermost liquid tight, heat sealable polyolefin layer and, arranged on the inner side of the bulk layer of paper or paperboard, towards the inside of a packaging container made from the packaging material, between the bulk layer and the innermost layer, said barrier film.

According to a further embodiment, the barrier sheet or film is bonded to the bulk layer by an intermediate adhesive, or thermoplastic polymer bonding layer, thus binding the surface of the durable DLC barrier coating of the barrier film to the bulk layer. According to a special embodiment the bonding layer is a polyolefin layer, such as in particular a layer of a polyethylene-based polyolefin copolymer or blend, including in the majority ethylene monomer units. Preferably, the bonding layer is binding the bulk layer to the barrier film by melt extrusion laminating the bonding polymer layer between a web of the bulk layer and a web of the film layer, and simultaneously pressing the three layers together while being forwarded through a lamination roller nip, thus providing a laminated structure, i.e. by so-called extrusion laminating the bulk layer to the barrier film.

According to a further embodiment, the polymer film substrate of the barrier film has an adhesion-promoting primer coating on its other side, opposite the side coated with the single-layer gradient durable DLC barrier coating, and wherein the barrier film is bonded to the second innermost liquid tight, heat sealable polyolefin layer by means of the adhesion-promoting primer coating.

In particular, it has been seen that the laminated packaging material according to the invention has excellent integrity, by providing excellent adhesion between the adjacent layers within the laminated construction and by providing good quality of the barrier coating. Especially, for the packaging of liquids, and wet food, it is important that the inter-layer adhesion within the laminated packaging material is maintained also under wet packaging conditions. Among various types of vapour deposition barrier coatings, it has been confirmed that this DLC type of vapour deposited barrier coatings, applied by means of a plasma coating technology, such as by plasma enhanced chemical vapour deposition, PECVD, has excellent laminate integrity properties. Barrier coatings from other types of vapour deposition chemistry, such as SiOx or AlOx coatings, do not, on the other hand, show good integrity properties in a laminated material of the same kind under wet and humid conditions. This extraordinary adhesion compatibility of this DLC coating to organic polymers, such as in particular polyolefins, also under wet conditions was unexpected and surprising, and makes such barrier films particularly suitable for liquid packaging.

In another embodiment, the barrier film of the laminated packaging material is a double barrier film, which comprises a first barrier film being laminated and bonded to a further identical or similar second barrier film by means of an interjacent thermoplastic bonding layer. The barrier coatings may be facing towards each other with the interjacent thermoplastic bonding layer in between. Alternatively, the barrier coatings may be facing away from each other, such that the adhesion-promoting primer coatings are bonded to each other by the the interjacent thermoplastic bonding layer. A further alternative is to stack the two films to each other such that both barrier coatings are facing in the same direction. The double barrier film may be further laminated to a bulk layer, such as a paper or paperboard or other cellulose-based material.

In a further embodiment, a first barrier film is laminated and bonded to a further identical or similar second barrier film by means of an interjacent thermoplastic bonding layer, the laminated packaging material further comprising a first outermost liquid tight, heat sealable polymer layer on the opposite, not laminated side of the first barrier film and a second innermost liquid tight, heat sealable polymer layer on the opposite, not laminated side of the second barrier film.

In particular, it has been seen that the laminated packaging material according to the invention has excellent integrity, by providing excellent adhesion between the adjacent layers within the laminated construction and by providing good quality of the barrier coating under high humidity conditions as in liquid carton laminate packaging. Especially, for the packaging of liquids, and wet food, it is important that the inter-layer adhesion within the laminated packaging material is maintained also under wet packaging conditions. Among various types of vapour deposition barrier coatings, it has been confirmed that this DLC type of vapour deposited barrier coatings, applied by means of a plasma coating technology, such as by plasma enhanced vapour deposition, PECVD, has excellent laminate integrity properties. Barrier coatings from other types of PECVD deposition chemistry, such as SiOx or AlOx coatings, do not, on the other hand, show good integrity properties in a laminated material of the same kind under wet and humid conditions. This extraordinary adhesion compatibility of DLC coatings to organic polymers, such as in particular polyolefins and most particularly polyethylenes, also under wet conditions was unexpected and surprising, and makes such barrier films particularly suitable for liquid carton packaging.

In a third aspect of the invention there is provided a packaging container comprising the laminated packaging material of the invention, intended for packaging of liquid, semi-solid or wet food. According to an embodiment, the packaging container is manufactured from the laminated packaging material of the invention, and according to a further embodiment it is in its entirety made of the laminated packaging material.

According to a still further embodiment, the packaging container may be formed from the laminated packaging material partly sealed, filled with liquid or semi-liquid food and subsequently sealed, by sealing of the packaging material to itself, optionally in combination with a plastic opening or top part of the package.

Over time, various vapour deposition barrier coatings have been considered in designing packaging materials that fulfil the gas barrier criteria as well as the needs of various mechanical and other physical properties.

Vapour deposited barrier layers may be applied by means of physical vapour deposition (PVD) or chemical vapour deposition (CVD) onto a substrate surface of a film material. The substrate material itself may contribute with some properties as well, but should above all have appropriate surface properties, suitable for receiving a vapour deposition coating, and working efficiently in a vapour deposition process.

Thin vapour deposited layers are normally merely nanometer-thick, i.e. have a thickness in the order of magnitude of nanometers, for example of from 1 to 500 nm (50 to 5000 Å), preferably from 1 to 200 nm, more preferably from 1 to 100 nm and most preferably from 1 to 50 nm.

One common type of vapour deposition coating, often having some barrier properties, in particular water vapour barrier properties, are so called metallisation coatings, e.g. aluminium metal physical vapour deposition coatings.

Such a vapour deposited layer, substantially consisting of aluminium metal may have a thickness of from 5 to 50 nm, which corresponds to less than 1% of the aluminium metal material present in an aluminium foil of conventional thickness for packaging, i.e. 6.3 µm. While vapour deposition metal coatings require significantly less metal material, they only provide a low level of oxygen barrier properties, at most, and need to be combined with a further gas barrier material in order to provide a final laminated material with sufficient barrier properties. On the other hand, it may complement a further gas barrier layer, which does not have water vapour barrier properties, but which is rather sensitive to moisture.

Other examples of vapour deposition coatings are aluminium oxide (AlOx, $Al_2O_3$) and silicon oxide (SiOx) coatings. Generally, such PVD-coatings are more brittle and less suitable for incorporation into packaging materials by lamination, while metallised layers as an exception do have suitable mechanical properties for lamination material despite being made by PVD.

Other coatings which have been studied for laminated packaging materials may be applied by means of a plasma enhanced chemical vapour deposition method (PECVD), wherein a vapour of a compound is deposited onto the substrate under more or less oxidising circumstances. Silicon oxide coatings (SiOx) may, for example, also be applied by a PECVD process, and may then obtain very good barrier properties under certain coating conditions and gas recipes. Unfortunately, SiOx coatings show bad adhesion properties when laminated by melt extrusion lamination to polyolefins and other adjacent polymer layers. Special expensive adhesives or adhesive polymers are needed to reach sufficient adhesion in a packaging laminate of the type intended for liquid carton packaging.

The vapour deposition coating of the invention, is a specific amorphous hydrogenated carbon barrier layer applied by a PECVD process, i.e. a specific durable diamond-like carbon (DLC). DLC defines a class of amorphous carbon material that displays some of the typical properties of diamond. Preferably, a hydrocarbon gas, such as e.g. acetylene or methane, is used as process gas in the plasma for producing the coating. It has been seen that the specific durable DLC coating of the invention, provides good adhesion to adjacent polymer or adhesive layers in a laminated packaging material. Particularly good adhesion to adjacent polymer layers, are seen with polyolefins and in particular polyethylene and polyethylene-based co-polymers.

According to an embodiment, the barrier film has a durable DLC barrier coating with tailor-made properties for the use in liquid carton packaging laminates. The durable DLC high barrier coating provides particularly good barrier properties to filled packaging containers made from a packaging laminate comprising the barrier film of the invention, by contributing with excellent mechanical properties as well as by resulting in excellent barrier properties to various substances migrating through such laminated materials in either inward or outward direction from a filled package, and in addition by excellent adhesion to adjacent polymer layers in a laminate. By this optimisation of barrier properties, the barrier film provides a packaging laminate and a packaging container with the whole contribution of oxygen barrier properties as well as water vapour barrier properties, and there is no need to add further oxygen barrier materials in order to produce an aseptic food packaging container for long term ambient storage, such as for up to 2-6 months, such as for up to 12 months. In addition, the durable DLC high barrier coating provides good barrier properties to various aroma and flavour substances present in the packed food product, to low-molecular substances possibly appearing in the adjacent layers of materials, and to odours and other gases than oxygen. Also, the durable DLC barrier coating, exhibits very good mechanical properties, as coated on a polymer film substrate, when laminated into a carton-based packaging laminate, withstanding lamination and subsequent fold-forming of the packaging laminate and sealing it into filled packages.

Accordingly, the durable DLC barrier coating has excellent gas barrier properties as well as water vapour barrier properties, along with a high crack onset strain (COS), which is a measure of how the oxygen barrier properties deteriorate with increased strain of a coated barrier film. The measurement of COS is an indirect indication of the mechanical strength and durability of the coated barrier film, including properties such as adhesion of the durable DLC barrier coating to the polymer film substrate and the cohesion within the durable DLC barrier coating, when used in lamination and conversion from laminated packaging material into fold formed, filled and sealed packaging containers.

The COS for a biaxially oriented PET film, coated with the durable DLC barrier coating of the invention, is higher than 2%, and this can normally be related to the oxygen barrier properties of the coating not starting to deteriorate until straining the film above 2%.

The durable DLC barrier coating is according to an embodiment, applied by means of a PECVD process, under vacuum conditions. The patent publication U.S. Pat. No. 7,806,981 discloses such a device and method for continuously coating a web substrate in a PECVD process. The device comprises a coating station with a vacuum chamber and within the vacuum chamber a rotating drum which supports and transports the web substrate and which forms a counter-electrode. A web of sheet or film substrate is thus un-wound from a roll and forwarded by travelling over a rotating drum, passing by the plasma reaction and coating zone of the reactor, and re-wound onto a roll on the other side of the drum. The device further comprises a plurality of magnetron electrodes on the periphery of the rotating drum. The magnetron electrodes are facing the surface of the web substrate. The device further comprises means for supplying a process gas to the space between the rotating drum and the magnetron electrodes. The magnetron electrodes are suitably powered with an alternating voltage at 40-50 kHz. The plasma is capacitively coupled to the power, and magnetically confined by the magnetron electrodes placed at a pre-determined distance from and around the drum electrode and its circumferential surface.

The rotating drum is according to an embodiment cooled, in order to keep sensitive substrates at a constant temperature. According to an embodiment, the polymer film substrate is cooled to a constant temperature of 10 degrees Celsius or lower.

The substrate is moved through the plasma zone at a constant speed, by being carried and transported by the drum, the speed being regulated by the drum rotational speed.

According to an embodiment, the magnetron electrodes may be individually powered, in order to enable better control of the process and a uniform plasma across the whole plasma reaction zone.

According to an embodiment, the gas employed for creating the plasma precursor gas of radicals, ions and molecules consists of acetylene. By controlling the gas flow at from 10 to 30 standard litres per minute, slm, and the power at from 20- to 50 kW, the ratio of the power to the acetylene gas flow at from 1.8 to 4, such as from 1.8 to 3.5, and by maintaining the gas pressure in the reactor at from 30 to 60 µbar, a good plasma is formed, in order to deposit the durable DLC barrier coating onto the polymer film substrate surface. According to an embodiment, a pre-treatment of the substrate surface, with argon, nitrogen or oxygen plasma or a mixture of one or more thereof, is preceding the plasma coating operation, in order to get the right interface between the polymer film substrate and the durable DLC coating. The thickness of the durable DLC high barrier coating may vary between 2 and 50 nm. When useful barrier properties are desired, the coating should better be thicker than 2 nm. Some low barrier properties may be obtainable already at 2 nm, however.

The web substrate can be a single-layered or multi-layered film. A multi-layered film particularly has a substrate surface polymer layer. The web substrate, i.e. the single layer polymer film or the substrate surface layer of the multilayer polymer film, can be of polyester, as e.g. a polyethyleneterephthalate (PET), polyethylenefuranoate (PEF) polybutyleneterephthalate (PBT) or polyethylenenaphthenate. The web substrate or film can also be of polyalkene, as e.g. polyethylene (PE), polypropylene (PP) or cyclo-olefine (co)polymer (COC). The web substrate or film can also be of polyamide (PA) or liquid-crystal polymer (LCP). The web substrate or film can also be of halogenated plastic as e.g. polyvinyl chloride (PVC) or polyvinylidene chloride (PVDC).

The polymer film substrate is according to an embodiment selected from an oriented polyethyleneterephthalate (OPET, BOPET) film, an oriented polypropylene (BOPP, OPP), an oriented polyethylene (OHDPE, BOHDPE, OLLDPE) film or an oriented polyamide (OPA, BOPA) film.

According to an embodiment, the polymer film substrate is a BOPET film of a thickness of 12 µm or lower, such as 8 µm or lower, such as 8-12 µm. Oriented films usually exhibit an increased strength and toughness against tearing or cutting through the film, and when included in laminated packaging materials such films can cause difficulties in opening of a package. By selecting as thin as possible polymer film substrates, the openability of a subsequently laminated packaging material will not be impaired, in comparison to laminated packaging materials in which the barrier materials are more brittle and the polymer materials are entirely made by melt extrusion coating and melt extrusion lamination.

PET films are robust and cost efficient films with good mechanical properties, and this makes them particularly suitable substrates for DLC vapour deposition coating and also due to some inherent high temperature resistance and relative resistance to chemicals and moisture. The surface of a PET film also has high smoothness and good affinity to vapour deposited DLC coatings and vice versa.

According to a further embodiment, the polymer film substrate is a BOPET film that has an adhesion-promoting primer coating applied to the other side of the BOPET film, in order to provide better bonding to adjacent layers on both sides of the barrier film, when laminating the film into a laminated packaging material. The adhesion-promoting primer coating may be applied by a composition comprising a compound selected from the group of aminosilanes and polyethyleneimines. A particular example of a primer suitable for the purpose of the invention is the 2DEF® primer used on the Hostaphan® RNK12 BOPET film from Mitsubishi, as used in the examples hereinafter.

DLC barrier coatings further have the advantage of being recyclable, without leaving residues that in the recycled content that contain elements or materials that are not naturally existing in nature and our surrounding environment.

According to an aspect of the invention, the durable barrier film is thus included in a laminated material suitable for packaging, whereby the durable barrier film is laminated to heat sealable, liquid-tight, polyolefin layers on both sides.

Suitable thermoplastics for the outermost and innermost heat sealable liquid-tight layers are polyolefins such as polyethylene and polypropylene homo- or co-polymers, preferably polyethylenes and more preferably polyethylenes selected from the group consisting of low density polyethylene (LDPE), linear LDPE (LLDPE), single site catalyst metallocene polyethylenes (m-LLDPE) and blends or copolymers thereof. According to a preferred embodiment, the outermost heat sealable and liquid-tight layer is an LDPE, while the innermost heat sealable, liquid-tight layer is a blend composition of m-LLDPE and LDPE for optimal lamination and heat sealing properties.

The same thermoplastic polyolefin-based materials, as listed regarding the outermost and innermost layers, and in particular polyethylenes, are also suitable in bonding layers interior of the laminated material, i.e. between a bulk or core layer, such as paper or paperboard, and the barrier film. In an embodiment, the thermoplastic bonding layer may be a polyethylene layer, such as a low density polyethylene (LDPE) layer.

According to an alternative embodiment, suitable bonding or tie layers interior of the laminated material, such as for example between the bulk or core layer and the barrier film, or between the outer heat sealable layer and the barrier- or primer-coated polymer film substrate, are also so-called adhesive thermoplastic polymers, such as modified polyolefins, which are mostly based on LDPE or LLDPE copolymers or, graft co-polymers with functional-group containing monomer units, such as carboxylic or glycidyl functional groups, e.g. (meth)acrylic acid monomers or maleic anhydride (MAH) monomers, (i.e. ethylene acrylic acid copolymer (EAA) or ethylene methacrylic acid copolymer (EMAA)), ethylene-glycidyl(meth)acrylate copolymer (EG(M)A) or MAH-grafted polyethylene (MAH-g-PE). Another example of such modified polymers or adhesive polymers are so called ionomers or ionomer polymers. Preferably, the modified polyolefin is an ethylene acrylic acid copolymer (EAA) or an ethylene methacrylic acid copolymer (EMAA).

Corresponding modified polypropylene-based thermoplastic adhesives or bonding layers may also be useful, depending on the requirements of the finished packaging containers.

Such adhesive polymer layers or tie layers are applied together with the respective outer layer in a co-extrusion coating operation.

However, normally, the use of the above described adhesive polymers should not be necessary for bonding to the DLC barrier coating of the invention. Sufficient and adequate adhesion to polyolefin layers, and in particular to polyethylene layers, as adjacent layers have been concluded, at a level of at least 200 N/m, such as at least 300 N/m.

Adhesion measurements are performed at room temperature with a 180° degrees peel force test apparatus (Telemetric Instrument AB), 24 h after the LDPE lamination. Peeling is performed at the DLC/LDPE interface, the peel arm being the barrier film. When needed, distilled water droplets are added to the peeled interface during peeling to assess the adhesion under wet conditions, i.e. the conditions when the laminated packaging material has been saturated with migrating moisture through the material layers, from the liquid stored in a packaging container made from the laminated material, and/or by storage in a wet or highly humid environment. The given adhesion value is given in N/m and is an average of 6 measurements.

A dry adhesion of more than 200 N/m ensures that the layers do not delaminate under normal package manufacturing conditions, e.g. when bending and fold-forming the laminated material. A wet adhesion of this same level ensures that the layers of the packaging laminate do not delaminate after filling and package formation, during transport, distribution and storage.

The interior bonding polymer layer may be coated directly onto the polymer film substrate having the durable DLC barrier layer coated thereon, by using common techniques and machines, e.g. those known for the lamination of an aluminum foil, in particular hot lamination (extrusion) of the polymer layer from a molten polymer. Also, using a pre-made polymer film and binding it directly to the barrier-coated carrier film by locally melting it, e.g. by applying heat with a hot cylinder or heated roller, is possible.

From the above it is apparent that the durable DLC barrier film can be handled in a similar way to an aluminium foil barrier in the lamination and conversion methods into a laminated packaging material. The lamination equipment and methods do not require any modification, by for example adding specific adhesive polymers or binder/tie layers as may be required in previously known plasma coated materials. In addition, the new barrier film including the durable DLC barrier layer coated thereon can be made as thin as an aluminium foil without adversely affecting the barrier properties in the final food package.

It has been seen that when laminating the durable DLC barrier coating surface to an adjacent layer of e.g. polyethylene, such as LDPE, the contributing oxygen barrier properties from the barrier film are increased to a 2-3 times higher value than by measuring on the barrier film itself, only. This barrier improvement by merely laminating the durable DLC barrier coating of the invention into a laminate, cannot be explained by a simple laminate theory, according to which $$1/OTR = SUM_i(1/OTR_i)$$

but does, thus, improve the total barrier beyond the individual contribution of OTR by each laminate layer. It is believed that it is the excellent adhesion between the DLC coating and the polyolefin surface that leads to a particularly well integrated interface between the two materials, and thereby to improved oxygen barrier properties.

In a preferred embodiment of the invention, the peel force strength between the durable DLC barrier coating layer and the further, laminating, bonding polymer layer as measured by a 180° peel test method under dry and wet conditions (by putting water at the peeling interface)) (as described above) is higher than 200 N/m, such as higher than 300 N/m. A dry adhesion of more than 200 N/m ensures that the layers do not delaminate under normal manufacturing conditions, e.g. when bending and fold-forming the laminated material. A wet adhesion of the same level ensures that the layers of the packaging laminate do not delaminate after filling and package formation, during transport, distribution and storage.

EXAMPLES AND DESCRIPTION OF PREFERRED EMBODIMENTS

In the following, preferred embodiments of the invention will be described with reference to the drawings, of which:

FIG. 1a is schematically showing, a barrier film in cross-section, comprising a polymer film substrate and a durable DLC barrier coating deposited thereon, according to the invention, FIG. 1b shows a similar film coated on its other side with an adhesive primer, FIG. 1c schematically shows a similar barrier film in cross-section, comprising a polymer film substrate which has been vapour deposition coated on both sides with the durable DLC barrier coating, in two consecutive vapour deposition coating steps, FIG. 2a is showing a schematic, cross-sectional view of a laminated packaging material according to an embodiment of the invention, FIG. 2b is showing a schematic, cross-sectional view of a further laminated packaging material according to an embodiment of the invention, comprising the durable barrier film of FIG. 1c, FIG. 3 shows schematically a method, for laminating the durable barrier film of the invention into a laminated packaging material for liquid packaging, having a core or bulk layer of paperboard or carton, FIG. 4 is showing a diagrammatic view of a plant for plasma enhanced chemical vapour deposition (PECVD) coating, by means of a magnetron plasma, onto a substrate film, FIGS. 5a, 5b, 5c and 5d are showing typical examples of packaging containers produced from the laminated packaging material according to the invention, FIG. 6 is showing the principle of how such packaging containers are manufactured from the packaging laminate in a continuous, roll-fed, form, fill and seal process, FIG. 7 shows a Dynamic Time of Flight Secondary ion Mass Spectroscopy diagram, ToF-SiMS, in which the elementary composition of the durable DLC coating is analysed through the depth of the coating, from the polymer film substrate surface C, over the interface to the barrier coating A, and up to the surface of the barrier coating B, wherein the polymer film substrate is a PET film, FIG. 8 shows a Dynamic Time of Flight Secondary ion Mass Spectroscopy diagram, ToF-SiMS, in which the elementary composition of the durable DLC coating is analysed through the depth of the coating, from the polymer film substrate surface C, over the interface A to the barrier coating and up to the surface of the barrier coating B, wherein the polymer film substrate is a polyamide, PA, film.

EXAMPLES

A 12 μm thick film of biaxially oriented polyethylene-terephthalate (BOPET Hostaphan RNK12 by Mitsubishi) was deposition coated in a roll-to-roll plasma reactor, by plasma enhanced chemical vapour deposition (PECVD) under vacuum conditions. The plasma being capacitively coupled to the power delivered at 40 kHz frequency, and being magnetically confined by unbalanced magnetron electrodes placed at a distance from the circumferential surface of a rotating drum, combined film-web transporting means and electrode. The film was first pre-treated with argon gas at a flow of 3 standard litres per minute, slm, and a pre-treatment power of 5 kW. Subsequently, the film was coated by depositing an amorphous, hydrogenated diamond-like coating DLC from a plasma formed from pure acetylene gas, at a total coating power of 24 kW and a total acetylene flow of 12 slm and a process gas pressure of about 0.03 mbar. The polymer film substrate was cooled to a constant temperature below 10 degrees Celsius by cooling means within the drum web-transporting means. The DLC coating was applied to a thickness of about 23 nm.

Different settings of the process were tried between different coating batches, and were evaluated by measurement of oxygen transmission, OTR, and water vapour transmission, WVTR.

The OTR of the uncoated BOPET film, measured at room temperature 23° C. and 50% RH is determined to be 110 $cm^3/m^2$/day at 1 atm. OTR was measured with Oxtran 2-60 (Mocon Inc.) equipment based on coulometric sensors, with a standard deviation of the results being ±0.5 $cm^3/m^2$/day.

The method for determining OTR identifies the amount of oxygen per surface and time unit at passing through a material at a defined temperature, given atmospheric pressure, and chosen driving force.

Water vapour transmission rate (WVTR) measurements were carried out by a Lyssy instrument (norm: ASTM F1249-01 using a modulated Infrared sensor for relative humidity detection and WVTR measurement) at 38° C. and 90% driving force. This test method is dedicated to measure Water Vapor Transmission Rate (WVTR) properties of films. The procedure is done according to ASTM F1249-01 using a modulated Infrared sensor for relative humidity detection and WVTR measurement.

TABLE 1

| Sample | Power (kW) | C2H2 flow (slm) | Ratio | OTR ($cm^3/m^2/day/atm$ 23° C., 50% RH) |
|---|---|---|---|---|
| F2-140922-A test 1 | 24 | 12 | 2.0 | 1.2 |
| F2-140922-A test 2 | 24 | 14 | 1.7 | 6.1 |
| F2-140922-A test 3 | 32 | 10 | 3.2 | 2.4 |
| F2-140922-A test 4 | 24 | 13 | 1.8 | 1.0 |
| F2-140922-A test 5 | 24 | 12 | 2.0 | 1.4 |
| F2-140922-A test 6 | 24 | 14 | 1.7 | 5.6 |
| F2-140922-A test 7 | 32 | 10 | 3.2 | 2.6 |
| F2-140922-A test-8 | 24 | 13 | 1.8 | 1.1 |

The precursor gas pressure in the plasma reaction zone during the sample test runs in Table 1 was kept at 42-52 μbar.

As seen from the results of the test runs in Table 1, a ratio between the power and the flow of between 1.8 and 3.5, may be preferable for optimal OTR results.

It has been seen that too large amount of gas precursor for the plasma seems to destroy the barrier properties.

Lowering the amount of precursor gas, on the other hand, slowly dilutes the plasma such that the barrier properties gradually decrease, i.e. the OTR and WVTR increase away from the optimal values of Table 1.

The durable barrier films obtained by samples 1, 3, 4, 5, 7 and 8, moreover showed excellent aroma barrier properties, chemical resistance and odour barrier properties. Importantly, the films exhibited high crack on-set strain, COS, above 2%. The good effects from this in lamination handling and in package forming from a laminated packaging material comprising the barrier film, are that the barrier coating is durable by being i.a. heat resistant and by having good mechanical properties at winding, rewinding, laminating, fold forming and sealing into packages.

Moreover, the barrier film and the surface of the durable DLC coating has excellent adhesion to an adjacent polyolefin laminate layer, which has been measured to be above 200 N/m, such as above 300 N/m, in adhering to an adjacent polyethylene layer.

TABLE 2

| Sample | Power (kW) | C2H2 flow (slm) | n (number of samples) | OTR $\mu$* ($cm^3/m^2/day/atm$ 23° C., 50% RH) | Sigma, $\delta$* | USL | Pressure (μbar) |
|---|---|---|---|---|---|---|---|
| F2-150204-A S3 | 24 | 12 | 6 | 1.5 | 1.2 | 2.3 | 32 |
| F2-150204-A S2 | 24 | 12 | 6 | 1.5 | 1.3 | 3.0 | 32 |
| F2-150205-A S3* | 24 | 12 | 6 | 0.8 | 1.3 | 1.7 | 32 |
| F2-150205-A S6* | 24 | 12 | 6 | 1.0 | 1.4 | 2.6 | 32 |
| F2-141009-A S2 | 24 | 12 | 9 | 1.3 | 1.3 | 2.8 | 33 |
| F2-141009-A S3 | 24 | 12 | 9 | 0.9 | 1.2 | 1.5 | 33 |
| F2-141009-A S6 | 24 | 12 | 9 | 1.4 | 1.3 | 2.8 | 33 |
| F2-150128-A S2* | 24 | 12 | 6 | 0.8 | 1.1 | 1.2 | 32 |
| F2-150128-A S6* | 24 | 12 | 6 | 0.8 | 1.4 | 2.4 | 32 |
| F2-141104-A S4 | 24 | 12 | 9 | 1.0 | 1.3 | 2.2 | 33 |
| F2-141015-A S4 | 24 | 12 | 9 | 1.1 | 1.2 | 1.9 | 33 |
| F2-141017-A S4 | 24 | 12 | 9 | 1.2 | 1.2 | 2.1 | 33 |
| F2-141006-A S2 | 24 | 12 | 6 | 1.6 | 1.2 | 3.0 | 33 |
| F2-141006-A S3 | 24 | 12 | 6 | 1.6 | 1.2 | 2.7 | 33 |
| F2-141006-B S2 | 24 | 12 | 6 | 1.7 | 1.2 | 2.9 | 33 |
| F2-141006-B S3 | 24 | 12 | 6 | 1.3 | 1.1 | 1.5 | 33 |
| F2-141008-A S2 | 24 | 12 | 6 | 1.6 | 1.1 | 2.2 | 34 |
| F2-141008-A S3 | 24 | 12 | 6 | 1.5 | 1.2 | 2.5 | 34 |

The oxygen transmission rates in Table 2 were measured on Mocon 2/60 at 23° C. and 50% RH. In all test runs of Table 2, the polymer film substrate was a 12 μm thick film of oriented PET. All samples except F2_150205* and F2_150128* were made from the same polymer film substrate as used in Table 1, i.e. (BOPET Hostaphan RNK12 by Mitsubishi). F2_150205* and F2_150128* were made from a different BOPET film having the thickness of 12 μm, also.

$\mu$* is the median value of the OTR and $\sigma$* is the multiplicative standard deviation. The USL is the upper specification limit given at 3 sigma ($\sigma^{*3}$) in a lognormal distribution.

n is the number of samples, i.e. the number of samples taken from the barrier film to do measurements on.

Water vapor transmission rates (WVTR) were not measured systematically for samples tabulated in Table 2. Other tests, performed with the same settings and conditions, reported WVTR of from 0.6 to 1.0 g/day/m² with 38° C. and 90% RH either on Mocon Permatran or on LYSSY equipments.

Examples—Adhesion Test

Films from 12 μm thick biaxially oriented polyethylene-terephthalate (BOPET Hostaphan RNK12 and RNK12-2DEF by Mitsubishi) were deposition coated with various coatings by plasma enhanced chemical vapour deposition (PECVD) under vacuum conditions, in a roll-to-roll plasma reactor. A diamond-like amorphous hydrogenated carbon coating, DLC, was coated on some film samples, in line with the invention, while other PECVD barrier coatings were coated on other samples. The other PECVD barrier coatings, subject of comparative examples, were SiOx, wherein x varied between 1.5 and 2.2, SiOxCy coatings and SiOxCyNz coatings, respectively, wherein (y+z)/x is from 1 to 1.5. These other silicon-containing barrier coatings were formed from organosilane pre-cursor gas compounds. The film samples according to the invention, were coated by depositing an amorphous, hydrogenated diamond-like coating DLC from a plasma formed from pure acetylene gas.

The plasma employed was capacitively coupled to the power delivered at 40 kHz frequency, and magnetically confined by unbalanced magnetron electrodes placed at a distance from the circumferential surface of a rotating drum, which functioned as a combined film-web transporting means and electrode. The polymer film substrate was cooled by cooling means within the drum web-transporting means.

The DLC coating was in a first example applied to a thickness of about 15-30 nm, and in a second example to a thickness of only about 2-4 nm.

The SiOx coatings were coated to a thickness of about 10 nm.

The thus barrier-coated substrate film samples, were subsequently extrusion coated with a 15 g/m2 thick layer of low density polyethylene (LDPE), of a type corresponding to LDPE materials of the laminate bonding layer that is conventionally used in order to extrusion laminate paperboard to aluminium foil in liquid carton packaging laminates.

The adhesion between the thus extrusion coated LDPE layer and the barrier-coated substrate PET film, was measured by a 180° peel test method under dry and wet conditions (by putting distilled water at the peeling interface) as described above. An adhesion of more than 200 N/m ensures that the layers do not delaminate under normal manufacturing conditions, e.g. when bending and fold-forming the laminated material. A wet adhesion of this same level ensures that the layers of the packaging laminate do not delaminate after filling and package formation, during transport, distribution and storage.

TABLE 1

| Coating type | Oxygen Barrier | Water Vapour Barrier | PE-laminate Peel force (N/m) Dry adhesion | PE-laminate Peel force (N/m) wet adhesion |
|---|---|---|---|---|
| SiOx (x = 1.5-2.2) | <3 cc at 36 Mean 1.5 cc | N/A | 40-50 | 0 |
| SiOxCy (y/x = 1-1.5) | <3 cc at 36 Mean 1.5 cc | 1 | 40-50 | 40-50 |
| SiOxCyNz (y + z/x = 1-1.5) | <3 cc at 36 Mean 1.5 cc | 1 | 200-300 | 100 |
| DLC ~25 nm | <3 cc at 36 Mean 1.5 cc | 0.8 | 350-400 | 350-400 |
| DLC ~25 nm on both sides of film | 0.5 ± 0.05 | 0.5 | 350-400 | 350-400 |
| DLC 2-4 nm | 60-80 | 5-6 | 350-400 | 350-400 |
| DLC 2-4 nm on both sides of film | 60-80 | 5-6 | 350-400 | 350-400 |

As can be seen from the results summarised in Table 1, there is some insufficient dry adhesion between pure SiOx barrier coatings and there onto extrusion coated LDPE, while the adhesion deteriorates completely under wet/humid conditions.

When experimenting with more advanced SiOx formulas, containing also carbon and nitrogen atoms, some improvement is seen in the dry and/or wet adhesion properties, as compared to the pure SiOx coating, but the wet adhesion properties remain insufficient, i.e. below 200 N/m.

The dry adhesion of a DLC coating to extrusion coated LDPE is slightly better than for the best of the tested SiOxCyNz coatings. The more important and unforeseeable difference, compared to the SiOxCyNz coatings is that the adhesion remains constant under wet or humid conditions, such as are the conditions for laminated beverage carton packaging.

Furthermore, and rather surprisingly, the excellent adhesion of DLC coatings at values above 200 N/m, remain unaffected also when the DLC coating is made thinner, and as thin as 2 nm, i.e. where there is actually no notable barrier properties obtained any longer. This is the case both regarding dry and wet conditions for the sample films.

Of course, when such films are laminated into packaging laminates of paperboard and thermoplastic polymer materials, it is advantageous to coat such a DLC coating on both sides of the film, in order to provide excellent adhesion on both sides of the film. Alternatively, the adhesion to adjacent layers on the opposite side of the substrate film, may be secured by a separately applied chemical primer composition, such as the 2 DEF® primer from Mitsubishi. A DLC adhesion-promoting layer is preferable from both environmental and cost perspective, since it only involves carbon atoms in the adhesion layer, and since it may be made very thin in order to just provide adhesion, or thicker in order to provide also barrier properties. At any thickness of a DLC-coating, the adhesion obtained is at least as good as that of a chemical primer (such as the 2 DEF® from Mitsubishi) under both dry and wet conditions. Double-sided applications of DLC coatings onto the polymer film substrate would have to be carried out in two consecutive process steps, however.

Further Example in Line with Adhesion Tests

A similar BOPET film to the one used in the above Example was coated with similar thin DLC coatings on one and two sides, as described in Table 2. OTR was measured as cc/m²/day/atm at 23° C. and 50% RH, by the same method as in the above Example. The DLC-coated films were subsequently laminated into packaging material structures including a paperboard with an outer LDPE layer, by means of a bonding layer of 15 g/m² of LDPE, and by being further coated on the opposite side of the film with an inside layer of a blend of LDPE and mLLDPE at 25 g/m². The OTR was measured on the laminated packaging material by the same method as described previously.

Subsequently, the laminated packaging materials were reformed into 1000 ml standard Tetra Brik® Aseptic packaging containers, on which the total oxygen transmission was further measured, by a Mocon 1000 equipment at 23° C. and 50% RH. The results from the measurements are presented in table 2.

TABLE 2

| Test ID | Film structure | Thickness DLC 1 coating (nm) | Thickness DLC 2 coating (nm) | OTR Film (mean) | OTR packaging material (mean) | OTR Package (mean) |
| --- | --- | --- | --- | --- | --- | --- |
| A | /BOPET/DLC2/ | — | 3.4 | 21.8 | — | — |
| A | /DLC1/BOPET/DLC2/ | 11.9 | 3.4 | 1.1 | 1.6 | 0.037 |
| B | /BOPET/DLC2/ | — | 3.4 | 19.3 | — | — |
| B | /DLC1/BOPET/DLC2/ | 3.5 | 3.4 | 10.5 | 1.8 | 0.027 |

Very surprisingly, it was found that when measured on laminated packaging material, and on packages from the packaging material, the oxygen barrier properties were on the same level or even improved by the film of Test B, although the film in Test B was coated with only two very thin DLC coatings, while in Test A, one of the coatings was thicker and actually intended for providing the resulting oxygen barrier properties of the film. By the measurements on the barrier-coated films, the film of Test A was indeed better, but when laminated into a final laminated packaging material structure, and used in a packaging container, both the two films were performing very well, and the film of Test B was even performing better than the film of Test A.

Thus, by the DLC-coated barrier films described above, high-integrity packaging laminates are provided, which have maintained excellent adhesion between layers also when used in liquid packaging, i.e. at subjecting the packaging material to wet conditions, and which may consequently protect other layers of the laminate from deterioration, in order to provide as good laminated material properties as possible. Since the durable DLC coatings in accordance with the invention provide both good oxygen barrier properties and water vapour barrier properties, it is a highly valuable type of barrier coating to be used in carton package laminates for liquid food products.

Further, relating to the attached figures:

In FIG. 1a, there is shown, in cross-section, a first embodiment of a barrier film 10a, of the invention. The polymer film substrate 11 is a PET or PA or polyolefin, preferably BOPET, film substrate coated with a durable, amorphous DLC coating 12, by means of plasma enhanced chemical vapour deposition, PECVD, coating, in order to improve the oxygen barrier (decrease the OTR value). The vapour deposited coating 12 is a carbon coating (C:H) which is evenly deposited to a brownish transparent coating colour. The thickness of the durable DLC coating is preferably from 5 to 50 nm, more preferably from 5 to 30 μm.

In FIG. 1b, a similar polymer film substrate 11 as in FIG. 1a, in this case a BOPET film substrate, was vapour deposition coated on the coating side with a similar, durable, amorphous DLC coating 12, by means of plasma enhanced chemical vapour deposition, PECVD, coating, in order to improve the oxygen barrier (decrease the OTR value). On its other side, opposite to the durable DLC barrier coating, the film substrate is coated with a thin layer of an adhesion-promoting primer 13, such as 2-DEF, a polyethyleneimine-based priming composition from Mitsubishi Chemicals.

In FIG. 1c, a similar polymer film substrate 11 as in FIGS. 1a and 1b, in this case a BOPET film substrate, was vapour deposition coated with a 20 nm thick durable DLC coating, in accordance with the present invention, on both sides, 12a, 12b. The OTR of the film was measured to be lower than 1 cc/day/m²/atm at 23° C. and 50% RH.

In FIG. 2a, a laminated packaging material 20a of the invention, for liquid carton packaging, is shown, in which the laminated material comprises a paperboard bulk layer 21 of paperboard, having a bending force of 320 mN, and further comprises an outer liquid tight and heat sealable layer 22 of polyolefin applied on the outside of the bulk layer 21, which side is to be directed towards the outside of a packaging container produced from the packaging laminate. The polyolefin of the outer layer 22 is a conventional low density polyethylene (LDPE) of a heat sealable quality, but may include further similar polymers, including LLDPEs. An innermost liquid tight and heat sealable layer 23 is arranged on the opposite side of the bulk layer 21, which is to be directed towards the inside of a packaging container produced from the packaging laminate, i.e. the layer 23 will be in direct contact with the packaged product. The thus innermost heat sealable layer 23, which is to form the strongest seals of a liquid packaging container made from the laminated packaging material, comprises one or more in combination of polyethylenes selected from the groups consisting of LDPE, linear low density polyethylene (LLDPE), and LLDPE produced by polymerising an ethylene monomer with a C4-C8, more preferably a C6-C8, alpha-olefin alkylene monomer in the presence of a metallocene catalyst, i.e. a so called metallocene-LLDPE (m-LLDPE).

The bulk layer 21 is laminated to a durable barrier film 28, comprising a polymer film substrate 24, which is coated on a first side with a layer of a thin PECVD vapour deposited layer of amorphous, durable DLC barrier material, in accordance with the present invention, 25, at a thickness of from 20 to 30 nm. On its second, opposite, side, the polymer film substrate is coated with an adhesion-promoting primer 27, in this case 2-DEF®, a polyethyleneimine-based priming composition from Mitsubishi Chemicals. The first side of the thus durable barrier-coated film 24 is laminated to the bulk layer 21 by an intermediate layer 26 of bonding thermoplastic polymer or by a functionalised polyolefin-based adhesive polymer, in this example by a low density polyethylene (LDPE). The intermediate bonding layer 26 is formed by means of extrusion laminating the bulk layer and the durable barrier film to each other. The thickness of the intermediate bonding layer 26 is preferably from 7 to 20 μm, more preferably from 12-18 μm. The innermost heat sealable layer 23 may consist of two or several part-layers of the same or different kinds of LDPE or LLDPE or blends thereof. Excellent adhesion will be obtained in the laminated material, in that the PECVD-coated durable DLC barrier coating is containing substantial amounts of carbon material, which exhibits good adhesion compatibility with polymers, such as polyolefins, such as in particular polyethylene and polyethylene-based co-polymers.

In FIG. 2b, a laminated packaging material 20b of the invention, for liquid carton packaging, is shown, in which the laminated material comprises a paperboard core layer 21, having a bending force of 320 mN, and further comprises an outer liquid tight and heat sealable layer 22 of polyolefin applied on the outside of the bulk layer 21, which side is to be directed towards the outside of a packaging container produced from the packaging laminate. The polyolefin of the outer layer 22 is a conventional low density polyethylene (LDPE) of a heat sealable quality, but may include further similar polymers, including LLDPEs. An innermost liquid tight and heat sealable layer 23 is arranged on the opposite side of the bulk layer 21, which is to be directed towards the inside of a packaging container produced from the packaging laminate, i.e. the layer 23 will be in direct contact with the packaged product. The thus innermost heat sealable layer 23, which is to form the strongest seals of a liquid packaging container made from the laminated packaging material, comprises one or more in combination of polyethylenes selected from the groups consisting of LDPE, linear low density polyethylene (LLDPE), and LLDPE produced by polymerising an ethylene monomer with a C4-C8, more preferably a C6-C8, alpha-olefin alkylene monomer in the presence of a metallocene catalyst, i.e. a so called metallocene-LLDPE (m-LLDPE).

The bulk layer 21 is laminated to a durable barrier film 28, which is coated on both sides with a thin PECVD vapour deposited layer of amorphous, durable DLC barrier material, in accordance with the present invention, 25a and 25b, each at a thickness of from 10 to 30 nm, in two consecutive PECVD coating operations, one per side of the substrate 24 polymer film. The thus durable barrier coated film 28 is laminated to the bulk layer 21 by an intermediate layer 26 of bonding thermoplastic polymer or by a functionalised polyolefin-based adhesive polymer, in this example by a low density polyethylene (LDPE). The intermediate bonding layer 26 is formed by means of extrusion laminating the bulk layer and the durable barrier film to each other. The thickness of the intermediate bonding layer 26 is preferably from 7 to 20 μm, more preferably from 12-18 μm. The innermost heat sealable layer 23 may consist of two or several part-layers of the same or different kinds of LDPE or LLDPE or blends thereof. Excellent adhesion will be obtained in the laminated material, in that the PECVD-coated durable DLC barrier coating is containing substantial amounts of carbon material, which exhibits good adhesion compatibility with polymers, such as polyolefins, such as in particular polyethylene and polyethylene-based co-polymers.

In FIG. 3, the lamination process 30 is shown, for the manufacturing of the packaging laminate 20, of FIG. 2, respectively, wherein the bulk layer 31 is laminated to the durable barrier film 10a or 10b (33) of FIGS. 1a and 1b, by extruding an intermediate bonding layer of LDPE 34 from an extrusion station and pressing together in a roller nip 36. The durable barrier film 10a; 10b; 33 has a durable DLC barrier coating, deposited on the surface of the polymer film substrate, whereby the DLC coating is to be directed towards the bulk layer when laminated at the lamination station 36. Subsequently, the laminated paper bulk and the barrier film passes a second extruder feedblock 37-2 and a lamination nip 37-1, where an innermost heat sealable layer 23; 37-3 is coated onto the barrier-film side 10a; 10b of the paper-film laminate forwarded from 36. Finally, the laminate, including an innermost heat sealable layer 37-3, passes a third extruder feedblock 38-2 and a lamination nip 38-1, where an outermost heat sealable layer of LDPE 22; 38-3 is coated onto the outer side of the paper layer. This latter step may also be performed as a first extrusion coating operation before lamination at 36, according to an alternative embodiment. The finished packaging laminate 39 is finally wound onto a storage reel, not shown.

FIG. 4 is a diagrammatic view of an example of a plant for plasma enhanced vapour deposition coating, PECVD, of hydrogenated amorphous diamond-like carbon coatings onto a polymer film substrate. The film substrate 44 is subjected, on one of its surfaces, to continuous PECVD, of a plasma, 50, in a plasma reaction zone created in the space between magnetron electrodes 45, and a chilled film-transporting drum 46, which is also acting as an electrode, while the film is forwarded by the rotating drum, through the plasma reaction zone along the circumferential surface of the drum. The plasma is formed from one or more gaseous organic hydrocarbon, such as acetylene or methane, and the coating is applied to a thickness of 1-500 nm, preferably 2-100 nm, such that a deposition coated film 1a or 1b is formed, respectively.

FIG. 5a shows an embodiment of a packaging container 50a produced from the packaging laminate 20 according to the invention. The packaging container is particularly suitable for beverages, sauces, soups or the like. Typically, such a package has a volume of about 100 to 1000 ml. It may be of any configuration, but is preferably brick-shaped, having longitudinal and transversal seals 51a and 52a, respectively, and optionally an opening device 53. In another embodiment, not shown, the packaging container may be shaped as a wedge. In order to obtain such a "wedge-shape", only the bottom part of the package is fold formed such that the transversal heat seal of the bottom is hidden under the triangular corner flaps, which are folded and sealed against the bottom of the package. The top section transversal seal is left unfolded. In this way the half-folded packaging container is still is easy to handle and dimensionally stable when put on a shelf in the food store or on a table or the like.

FIG. 5b shows an alternative, preferred example of a packaging container 50b produced from an alternative packaging laminate 20 according to the invention. The alternative packaging laminate is thinner by having a thinner paper bulk layer 21, and thus it is not dimensionally stable enough to form a parallellepipedic or wedge-shaped packaging container, and is not fold formed after transversal sealing 52b. It will thus remain a pillow-shaped pouch-like container and be distributed and sold in this form.

FIG. 5c shows a gable top package 50c, which is fold-formed from a pre-cut sheet or blank, from the laminated packaging material comprising a bulk layer of paperboard and the durable barrier film of the invention. Also flat top packages may be formed from similar blanks of material.

FIG. 5d shows a bottle-like package 50d, which is a combination of a sleeve 54 formed from a pre-cut blanks of the laminated packaging material of the invention, and a top 55, which is formed by injection moulding plastics in combination with an opening device such as a screw cork or the like. This type of packages are for example marketed under the trade names of Tetra Top® and Tetra Evero®.

Those particular packages are formed by attaching the moulded top 55 with an opening device attached in a closed position, to a tubular sleeve 54 of the laminated packaging material, sterilizing the thus formed bottle-top capsule, filling it with the food product and finally fold-forming the bottom of the package and sealing it.

FIG. 6 shows the principle as described in the introduction of the present application, i.e. a web of packaging material is formed into a tube 61 by the longitudinal edges 62 of the web being united to one another in an overlap joint 63. The tube is filled 64 with the intended liquid food product and is divided into individual packages by repeated transversal seals 65 of the tube at a pre-determined distance from one another below the level of the filled contents in the tube. The packages 66 are separated by incisions in the transversal seals and are given the desired geometric configuration by fold formation along prepared crease lines in the material.

FIG. 7 shows an intensity-versus-time diagram from surface analysis by Time of Flight Secondary ion Mass Spectroscopy ToF-SiMS at varying depths of the durable DLC barrier coating, deposited onto a polyethyleneterephthalate, PET, film substrate.

FIG. 8 shows an intensity-versus-time diagram from surface analysis by Time of Flight Secondary ion Mass Spectroscopy ToF-SiMS at varying depths of the durable DLC barrier coating, deposited onto a polyamide, PA, film substrate.

Figure 1A:
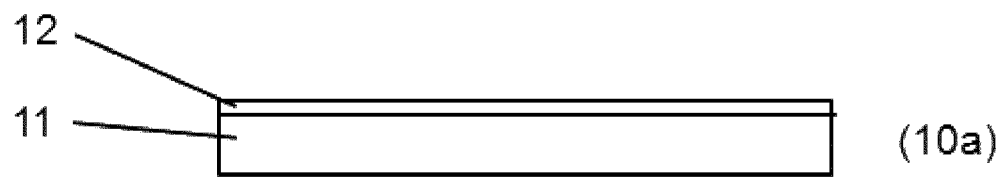
Figure 1B:
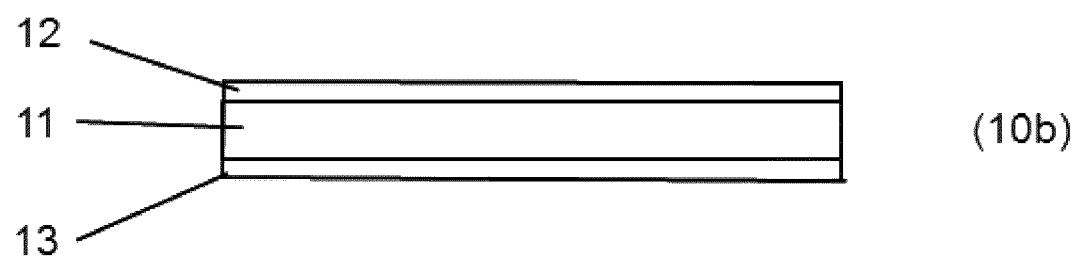
Figure 1C:
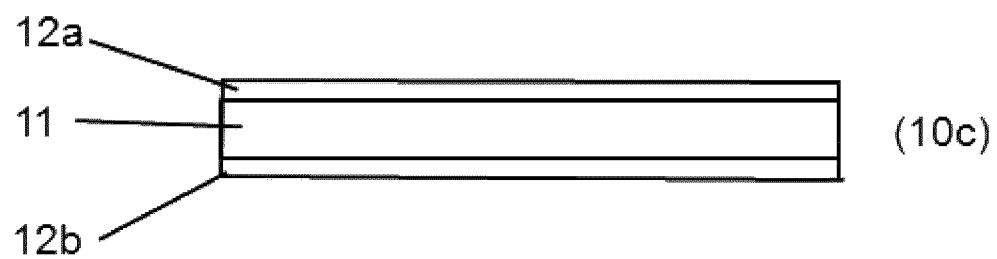
Figure 2A:
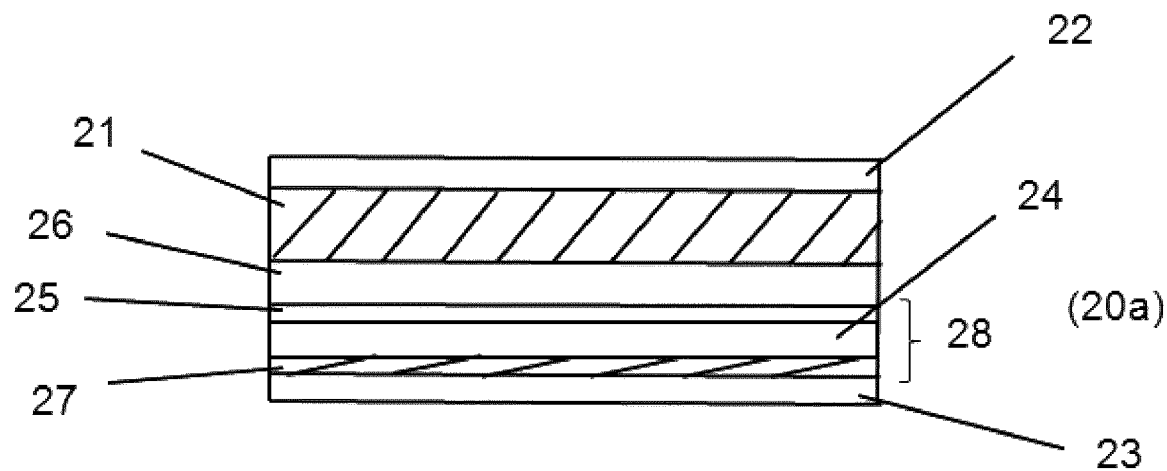
Figure 2B:
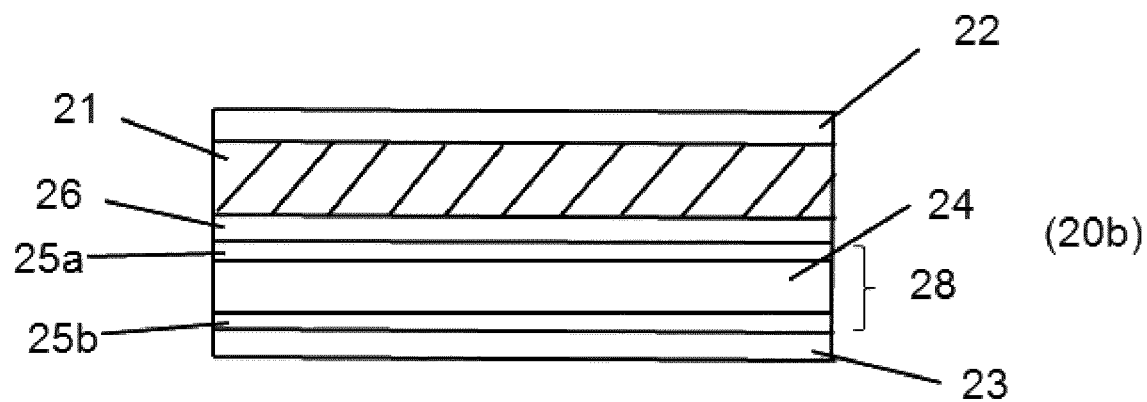
Figure 3:
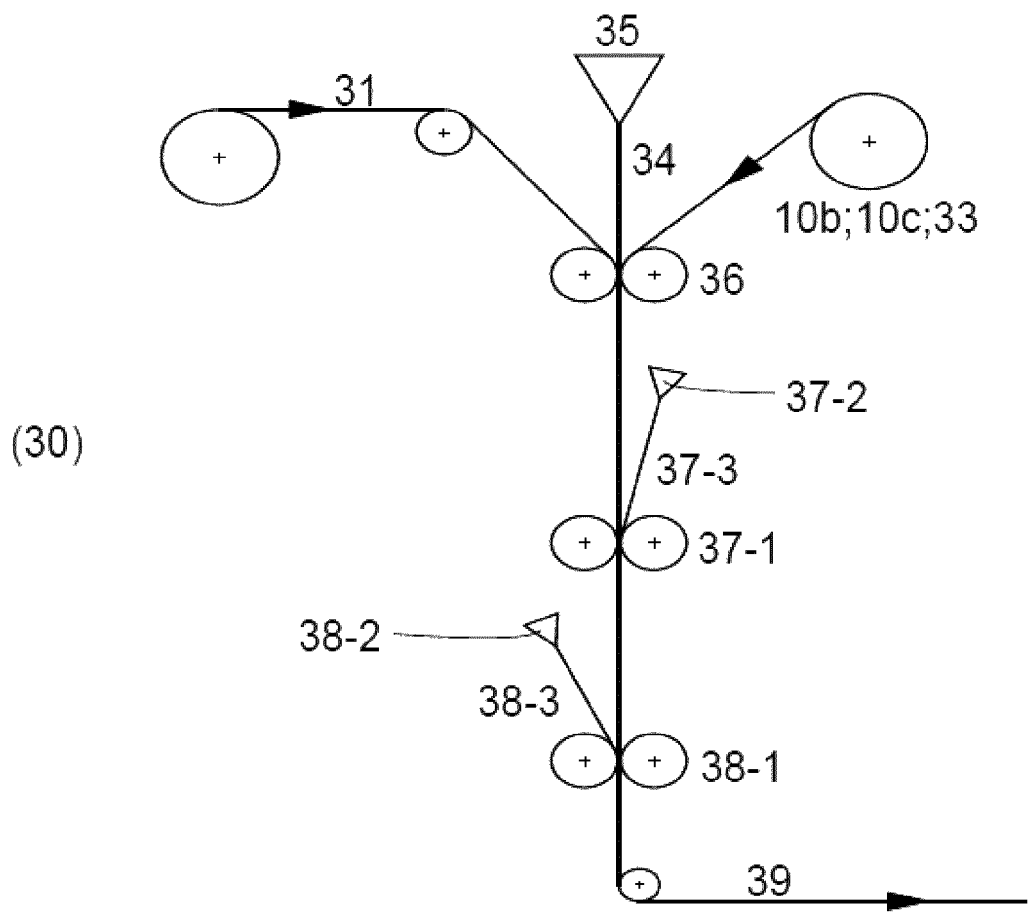
Figure 4:
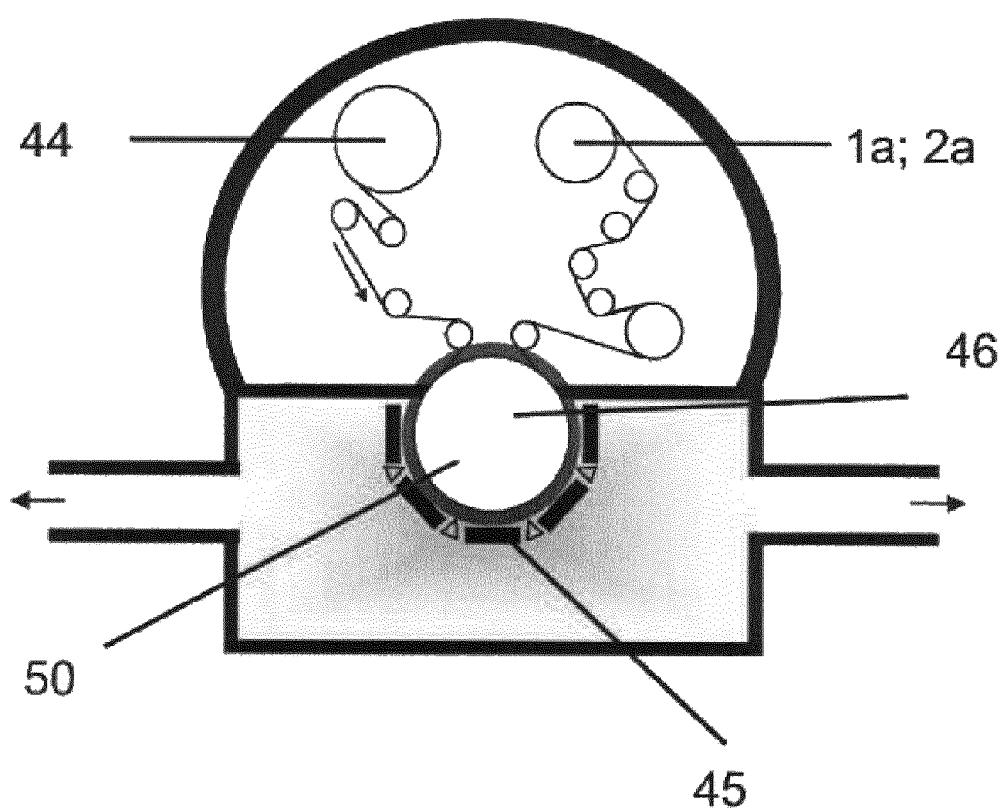
Figure 5A:
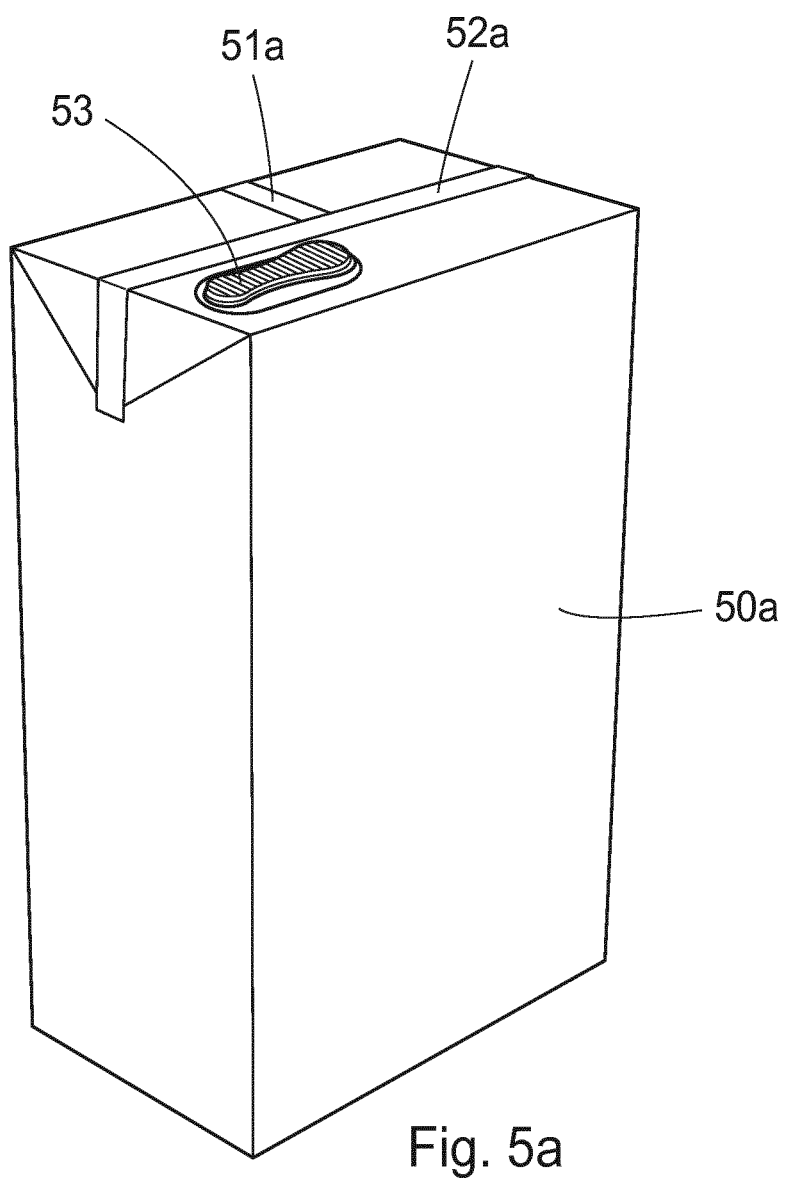
Figure 5B:
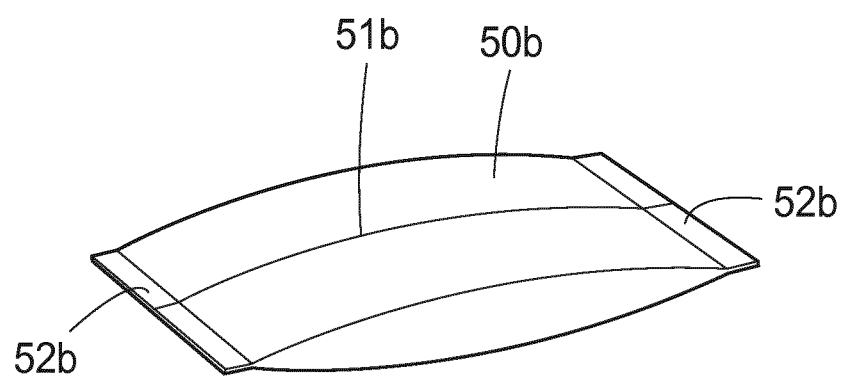
Figure 5C:
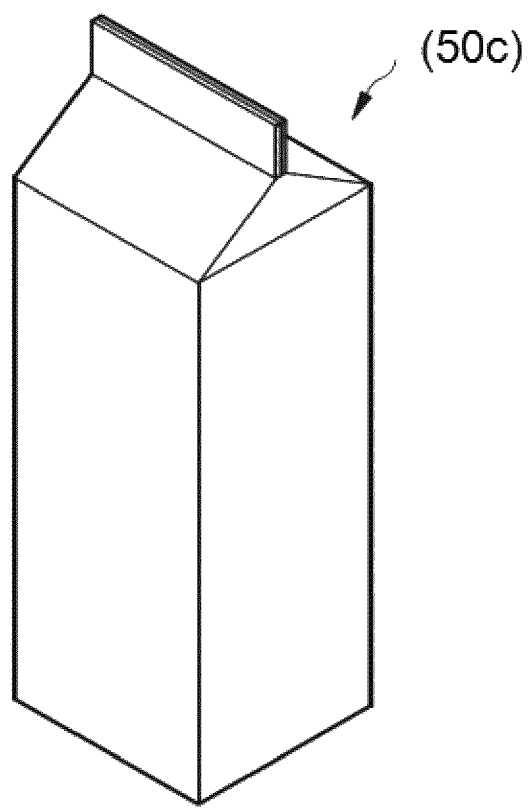
Figure 5D:
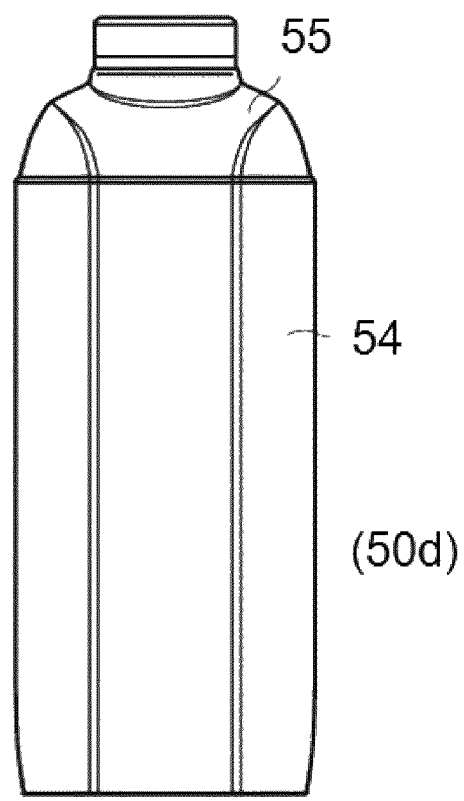
Figure 6:
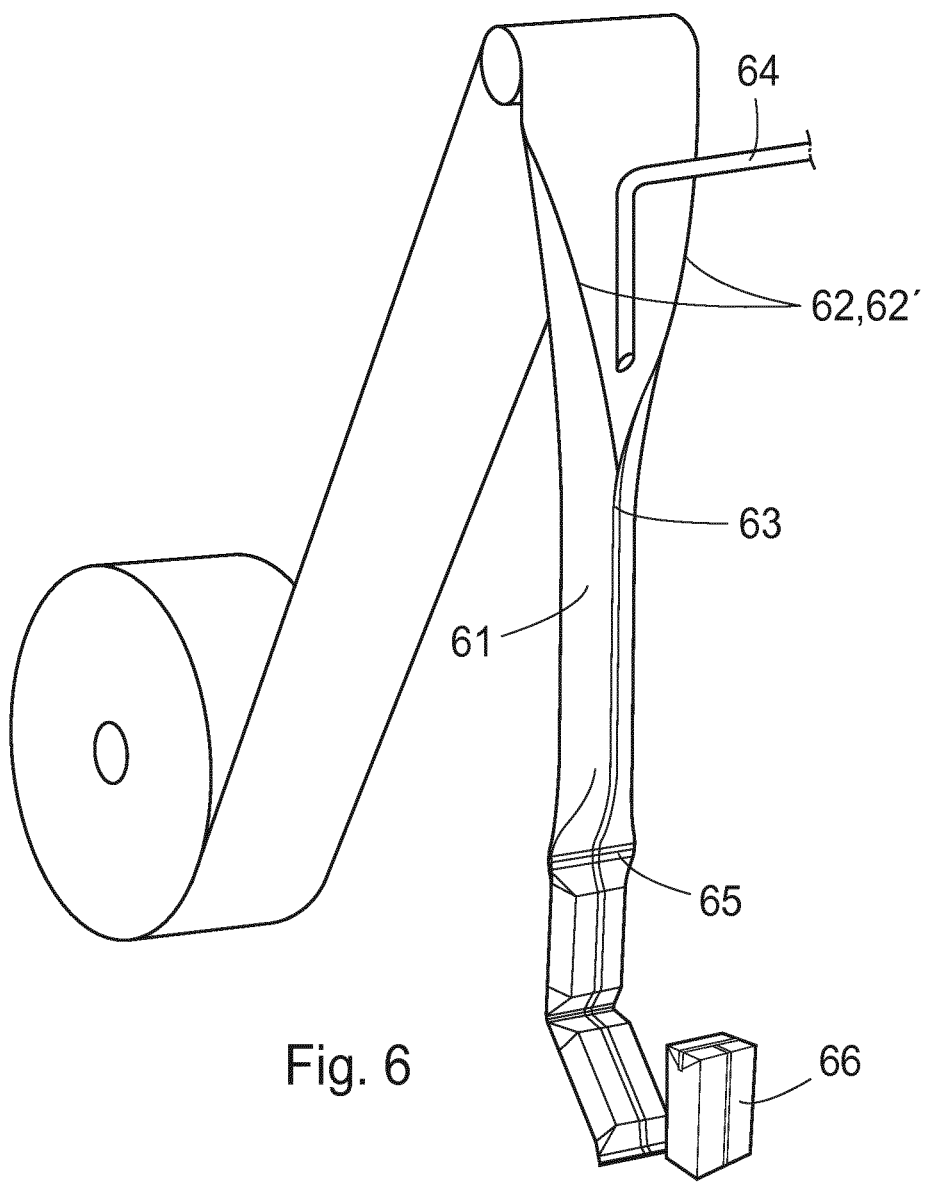

Secondary ion mass spectrometry (SiMS) is a technique used to analyze the composition of solid surfaces and thin films by sputtering the surface of the sample with a focused primary ion beam and collecting and analyzing ejected secondary ions. The mass/charge ratios of these secondary ions are measured with a mass spectrometer to determine the elemental, isotopic, or molecular composition of the surface to a depth of 1 to 2 nm. Due to the large variation in ionization probabilities among different materials, SiMS is generally considered to be a qualitative technique, and is a very sensitive surface analysis technique, with elemental detection limits ranging from parts per million to parts per billion.

The ToF-SiMS method measures the composition of solid surfaces and thin films, and can thus do this at different depths of the material, in order to determine the chemical structure of and within the coating.

The ToF-SiMS measurements were performed using a TOF 5 equipment from IONTOF GmBH company
Analysis Conditions:
  Primary ion $Bi^+$ 25 keV, I~1.86 pA
  Analysed area 70×70 $\mu m^2$, 256×256 pixels
  Negative secondary ions analysed
  Charge compensation (<20 eV)
Sputtering Conditions:
  Primary ion $Cs^+$ 500 eV, 40 nA
  Sputtering area: 250×250 $\mu m^2$
Analysis/Sputtering cycling:
  2 analysis scans from 0 to 300 uma (time of flight max=50 μs)
  sputtering: 1.638 seconds
Pause Between Sputtering and Analysis: 0.5 Second.

Thickness measurements were performed by Transmission Electronic Microscopy using on a Titan 80-300, FEI equipment. Samples are prepared by ultramicrotomy on an EM UC6 Microtome from Leica.

The diagrams 7-8, show that there is a greatly decreasing gradient of oxygen-ion concentration, from below the surface of the polymer film substrate C at a first zone, through a second zone at the interface A between the substrate surface and the coating, to a third zone, i.e. the zone of the coating surface B, and a rapid increase again of the oxygen concentration within this third zone, to more or less recover the level of the initial concentration again. Thus, the PECVD coating process first modifies the surface of the polymer film at zone C, starting from below the initial polymer surface, and starts building the barrier coating at the interface A, up to the full thickness of the barrier coating, at the top surface thereof, at B. The concentrations of the carbon and hydrogen ions remain at a substantially constant level throughout the three coating zones. According to an embodiment, the durable DLC coating of the invention characteristically exhibits a relatively smaller, temporary depletion of hydrogen and triple-carbon ions, during the second zone A, while the concentrations of single- and double-carbon ions remain substantially constant throughout all three zones and the depth of the coating. Although the diagram becomes a little different when the coating is applied and analysed on a polyamide film substrate compared to a PET film substrate, it can be seen that the characteristics and change patterns regarding the ion contents in the coatings are very similar.

We have thus seen that the specific DLC barrier coatings made by our method, and having these characteristics when analysed by ToF-SiMS, provide both optimal initial oxygen barrier and water vapour barrier properties of a coated film, and excellent durability regarding said barrier properties after being exposed to mechanical strain, i.e. when the film is used in lamination and fold-forming and sealing of laminated materials comprising the films, into packages. The temporary depletion of the hydrogen and triple-carbon ion concentration at the interface A between the coating and the film surface, indicates that there is covalent bonding between the coating and the film, which is believed to be at least a contributing factor to the good mechanical properties at strain, including adhesion of the coating to the film substrate and internal cohesion within the coating.

The invention is not limited by the embodiments shown and described above, but may be varied within the scope of the claims.

The invention claimed is:

1. A barrier film for use in laminated packaging materials for liquid food products, comprising:
  a polyethylene terephthalate (PET) film substrate having a thickness of 4-12 μm;
  a durable vapor-deposited diamond-like carbon (DLC) barrier coating on a first side of the substrate at a thickness from 10 to 35 nm, the DLC barrier coating configured to inhibit the passage of gas and water vapor, the DLC barrier coating comprising a single-layer gradient of DLC and a DLC barrier coating thickness; and
  an adhesion-promoting primer coating on a second side of the substrate, opposite the first side deposited with the DLC barrier coating, wherein the adhesion-promoting primer coating is a second DLC barrier coating;
  wherein the DLC barrier coating thickness extends from an interface of the DLC barrier coating with the PET film substrate to a surface of the DLC barrier coating, the DLC barrier coating exhibiting a decreasing gradient of oxygen ion concentration from the interface to a minimum value and a subsequent increasing gradient of oxygen ion concentration from the minimum value to the surface of the DLC barrier coating; and
  wherein the decreasing gradient comprises a slope of $5·10^4$ to $5·10^5$ counts per nanometer coating thickness as depicted by a Dynamic Time of Flight Secondary ion Mass Spectroscopy (ToF-SiMS) intensity-versus-thickness surface analysis diagram calibrated to a TEM microscopy thickness measurement, the minimum value located at 40 to 60% of the DLC barrier coating thickness as measured from the surface of the DLC barrier coating, and wherein the barrier film has a crack onset strain (COS) equal to or greater than 2%.

2. The barrier film as claimed in claim 1, wherein a local and temporary concentration depletion of hydrogen and carbon ions is located 10-15 nm from the surface of the substrate.

3. The barrier film as claimed in claim 1, wherein the polymer film substrate is an oriented PET film.

4. The barrier film as claimed in claim 1, wherein the DLC barrier coating has a sp2 hybrid bond content of 60 to 70%, based on the total content of sp2 and sp3 hybrid bonds.

5. A laminated packaging material comprising the barrier film as claimed in claim 1.

6. The laminated packaging material as claimed in claim 5, further comprising a first outermost liquid tight, heat sealable polyolefin layer and a second innermost liquid tight, heat sealable polyolefin layer.

7. The laminated packaging material as claimed in claim 5, further comprising a bulk layer comprising paper, paperboard or other cellulose-based material, a first outermost liquid tight, heat sealable polyolefin layer and a second innermost liquid tight, heat sealable polyolefin layer, wherein the barrier sheet is positioned between the bulk layer and the second innermost liquid tight, heat sealable polyolefin layer.

8. The laminated packaging material as claimed in 7, wherein the barrier film is bonded to the bulk layer by an intermediate thermoplastic polymer bonding layer, wherein the intermediate thermoplastic polymer bonding layer binds the surface of the DLC barrier coating to the bulk layer.

9. The laminated packaging material as claimed in claim 8, wherein the adhesion-promoting primer coating bonds the barrier film to the second innermost liquid tight, heat sealable polyolefin layer.

10. The laminated packaging material as claimed in claim 5, wherein the barrier film is a double barrier film, wherein the double barrier film comprises a first barrier film, a second barrier film and an interjacent thermoplastic bonding layer, and wherein the interjacent thermoplastic bonding layer bonds the first barrier film and the second barrier film.

11. The laminated packaging material as claimed in claim 10, further comprising a first outermost liquid tight, heat sealable polymer layer and a second innermost liquid tight, heat sealable polymer layer, wherein the first outermost liquid tight, heat sealable polymer layer is positioned on a second side of the first barrier film, wherein the second side of the first barrier film is opposite the first side of the first barrier film bonded with the interjacent thermoplastic bonding layer, wherein the second innermost liquid tight, heat sealable polymer layer is positioned on a second side of the second barrier film, and wherein the second side of the second barrier film is opposite the first side of the second barrier film bonded with the interjacent thermoplastic bonding layer.

12. A packaging container comprising the laminated packaging material as claimed in claim 5.

13. The barrier film as claimed in claim 1, wherein the concentrations of hydrogen and carbon ions remain at a substantially constant level throughout the DLC barrier coating thickness.

14. The barrier film as claimed in claim 1, wherein the decreasing gradient comprises a slope of about $10^5$ counts per nanometer coating thickness as depicted by a Dynamic Time of Flight Secondary ion Mass Spectroscopy (ToF-SiMS) intensity-versus thickness surface analysis diagram calibrated to a TEM microscopy thickness measurement.

15. The barrier film as claimed in claim 1, wherein the decreasing gradient comprises a slope of about $8 \cdot 10^4$ to $1.2 \cdot 10^5$ counts per nanometer coating thickness as depicted by a Dynamic Time of Flight Secondary ion Mass Spectroscopy (ToF-SiMS) intensity-versus thickness surface analysis diagram calibrated to a TEM microscopy thickness measurement.

* * * * *

UNITED STATES PATENT AND TRADEMARK OFFICE
CERTIFICATE OF CORRECTION

PATENT NO. : 11,046,059 B2  
APPLICATION NO. : 15/771330  
DATED : June 29, 2021  
INVENTOR(S) : Jerome Larrieu et al.

Page 1 of 1

It is certified that error appears in the above-identified patent and that said Letters Patent is hereby corrected as shown below:

On the Title Page

On page 2, in Column 2, item (56), Foreign Patent Documents, Line 4, delete "11/2004" and insert -- 04/2005 --.

In the Specification

In Column 3, Lines 18-19, delete "heat-sealable" and insert -- heat sealable --.
In Column 4, Line 47, delete "napthanate" and insert -- naphthalate --.
In Column 4, Line 64, delete "napthanate" and insert -- naphthalate --.
In Column 5, Line 2, delete "a the" and insert -- the --.
In Column 7, Line 33, delete "the the" and insert -- the --.
In Column 13, Line 27, delete "interface))" and insert -- interface) --.
In Column 16, Line 9, delete "i.a." and insert -- i.e. --.
In Column 21, Line 62, delete "1 b" and insert -- 1b --.
In Column 21, Line 64, delete "and" and insert -- 35 and --.
In Column 22, Line 52, delete "parallellepipedic" and insert -- parallelepipedic --.

In the Claims

In Column 24, Lines 66-67, Claim 1, delete "Secondary ion Mass Spectroscopy (SiMS)" and insert -- Secondary ion Mass Spectrometry (SiMS) --.
In Column 25, Line 32, Claim 8, delete "claimed in" and insert -- claimed in claim --.
In Column 26, Lines 29-30, Claim 14, delete "Secondary ion Mass Spectroscopy (SiMS)" and insert -- Secondary ion Mass Spectrometry (SiMS) --.
In Column 26, Lines 35-36, Claim 15, delete "Secondary ion Mass Spectroscopy (SiMS)" and insert -- Secondary ion Mass Spectrometry (SiMS) --.

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*